United States Patent
Teklemariam

(10) Patent No.: US 12,228,624 B1
(45) Date of Patent: Feb. 18, 2025

(54) METHOD AND SYSTEM TO ENHANCE CAVITY-SPIN COUPLING AND HYPERPOLARIZE SPIN SYSTEMS

(71) Applicant: Grum Teklemariam, Fairfax, VA (US)

(72) Inventor: Grum Teklemariam, Fairfax, VA (US)

( * ) Notice: Subject to any disclaimer, the term of this patent is extended or adjusted under 35 U.S.C. 154(b) by 177 days.

(21) Appl. No.: 18/174,679

(22) Filed: Feb. 27, 2023

Related U.S. Application Data

(63) Continuation of application No. 17/821,054, filed on Aug. 19, 2022, now abandoned.

(60) Provisional application No. 63/236,757, filed on Aug. 25, 2021.

(51) Int. Cl.
    *G01R 33/28* (2006.01)

(52) U.S. Cl.
    CPC .................. *G01R 33/282* (2013.01)

(58) Field of Classification Search
    CPC ..................................................... G01R 33/282
    See application file for complete search history.

(56) References Cited

PUBLICATIONS

Sinatra, Alice, Spin-Squeezed states for metrology, Appl. Phys. Lett. 120, 120501 (2022) (Year: 2022).*
Leroux et.al., Implementation of Cavity Squeezing of a Collective Atomic Spin, PRL 104, 073602 (2010) 2010 (Year: 2010).*
Schleieler-Smith, PhD Dissertation, Cavity-Enabled Spin Squeezing, Massachusets Institute of Technology, 2011 (Year: 2011).*

\* cited by examiner

*Primary Examiner* — G. M. A Hyder
(74) *Attorney, Agent, or Firm* — Oblon, McClelland, Maier & Neustadt, L.L.P.

(57) ABSTRACT

A method to hyperpolarize a spin ensemble includes resonantly coupling the spin ensemble to a cold cavity that is at a temperature below a spin temperature of the spin ensemble, coupling the cold cavity to a squeezing cavity that is detuned from the cold cavity, the squeezing cavity squeezing the cold cavity such that coupling of the cold cavity to the spin ensemble increases to a sufficient strength to enable a spontaneous emission process to exceed a spin thermal relaxation process of the spin ensemble, and coupling the squeezing cavity to a broadband squeezing cavity having a same squeezing parameter as the squeezing cavity and being phase-matched with the squeezing cavity for suppressing or canceling squeezed noise or heat generated by the squeezing cavity.

21 Claims, 9 Drawing Sheets

METHOD AND SYSTEM TO ENHANCE CAVITY-SPIN COUPLING AND HYPERPOLARIZE SPIN SYSTEMS

BACKGROUND

A method is disclosed for enhancing cavity-spin coupling in magnetic resonance to enable entropy removal or spin squeezing of an ensemble of spins and obtain a non-thermal distribution, thereby significantly increasing the intrinsic polarization of the spin ensemble.

Conventionally, a system to increase the signal-to-noise ratio (SNR) has used cooled, cryogenic receivers so that electronic noise is suppressed. However, with increasing field, the subject or sample noise will overtake the electronic noise and limit the SNR gains. Similarly, using superconducting receivers can yield very high resonator quality factors, due to their negligible resistance, also increasing the SNR, but again these systems deteriorate in higher magnetic fields where the superconductors transition over to normal conductivity.

Moreover, high resonator quality factors come with narrowband reception and can limit the bandwidth necessary to perform magnetic resonance imaging (MRI) that requires several hundred kHz for encoding the spatial distribution of nuclei in the subject under study. The use of phased array coils has also yielded nominal increases in SNR. Presently, many new directions are being developed to address the perennial problem of SNR in magnetic resonance.

Recently, new hyperpolarization strategies have achieved success with methods such as Dynamic Nuclear Polarization (DNP) and Para-hydrogen Induced Polarization (PHIP) that require external polarized agents in cryogenic environments and introduced into the sample or subject.

These approaches require the introduction of an external agent that is prepolarized so that this polarization is then transferred. Although successful, these approaches are typically one-time polarization steps and require continued reintroduction of the prepolarized external agent. Even more recently, the use of Nitrogen Vacancy (NV) defect centers in nanodiamonds has emerged as a means to transfer the polarization of the optically pumped hyperpolarized electrons to nearby nuclei or protons.

Although promising as a hyperpolarization platform, it is limited in the number of constituents that can be polarized due to the low concentration of defect electrons and the need to be in near contact to transfer the polarization.

SUMMARY OF THE INVENTION

In view of the foregoing and other exemplary problems, drawbacks, and disadvantages of the conventional methods and systems, an exemplary object of the present invention is to provide a global solution that can redistribute the intrinsic thermal distribution on-demand, and very importantly without the introduction of an external agent and achieve higher polarization using circuit quantum electrodynamics (cQED) techniques.

To achieve the exemplary object described above, an exemplary aspect of the present invention includes a method to hyperpolarize a spin ensemble.

The method includes resonantly coupling the spin ensemble to a cold cavity that is at a temperature below a spin temperature of the spin ensemble, coupling the cold cavity to a squeezing cavity that is detuned from the cold cavity, the squeezing cavity squeezing the cold cavity such that coupling of the cold cavity to the spin ensemble increases to a sufficient strength to enable a spontaneous emission process to exceed a spin thermal relaxation process of the spin ensemble, and coupling the squeezing cavity to a broadband squeezing cavity having a same squeezing parameter as the squeezing cavity and being phase-matched with the squeezing cavity for suppressing or canceling squeezed noise or heat generated by the squeezing cavity.

Another exemplary aspect of the present invention includes a method to hyperpolarize a spin ensemble, in which the method includes resonantly coupling the spin ensemble to a squeezing cavity, which is at a temperature below a spin temperature of the spin ensemble, to enable a spontaneous emission process to exceed a spin thermal relaxation process of the spin ensemble, and coupling the squeezing cavity to a broadband squeezing cavity having a same squeezing parameter as the squeezing cavity and being phase-matched with the squeezing cavity for suppressing or canceling squeezed noise or heat generated by the squeezing cavity.

Yet another exemplary aspect of the present invention includes a hyperpolarizing system that includes a spin ensemble immersed in a static magnetic field and being subject to hyperpolarization, a squeezing cavity held at a temperature below a spin temperature of the spin ensemble, the spin ensemble being resonantly coupled to a squeezing cavity to enable a spontaneous emission process to exceed a spin thermal relaxation process of the spin ensemble, and a broadband squeezing cavity coupled to the squeezing cavity, the broadband squeezing cavity having a same squeezing parameter as the squeezing cavity and being phase-matched with the squeezing cavity for suppressing or canceling squeezed noise or heat generated by the squeezing cavity.

BRIEF DESCRIPTION OF THE DRAWINGS

The exemplary aspects of the invention will be better understood from the following detailed description of the exemplary embodiments of the invention with reference to the drawings.

DETAILED DESCRIPTION OF EXEMPLARY EMBODIMENTS

Exemplary embodiments of the invention will now be described with reference to the drawings.

The SNR in magnetic resonance has the following key dependencies:

$$SNR \propto \frac{\omega M}{V_m N_{rms}} \sqrt{Q}$$

where ω is the resonance frequency, M is the magnetization, $V_m$ is the mode volume, Q is the resonator quality factor and $N_{rms}$ is the Johnson noise. Since the intrinsic signal of the spins is extremely weak (e.g., due to their thermal magnetization distribution of a 1 ppm difference in the aligned versus anti-aligned orientation for nuclei at ambient temperatures and typical magnetic fields of several Teslas) in practice a variety of solutions have been devised to increase the SNR.

For example, by increasing the magnetic field the resonance frequency, ω and the magnetization, M will increase proportionally and over the past several decades one direction of research has been to develop superconducting magnetic field generators that produce greater and greater fields.

In nuclear magnetic resonance (NMR) applications, the magnetic field exceeds 20 Tesla and in magnetic resonance imaging (MRI) applications up to 7-Tesla systems are clinically available, while 11-Tesla research systems are used for specialized studies.

An exemplary aspect of the present invention is directed to increasing magnetization by redistributing the intrinsic thermal distribution on-demand, without the introduction of an external agent to achieve higher polarization using cQED techniques.

Figure 1:
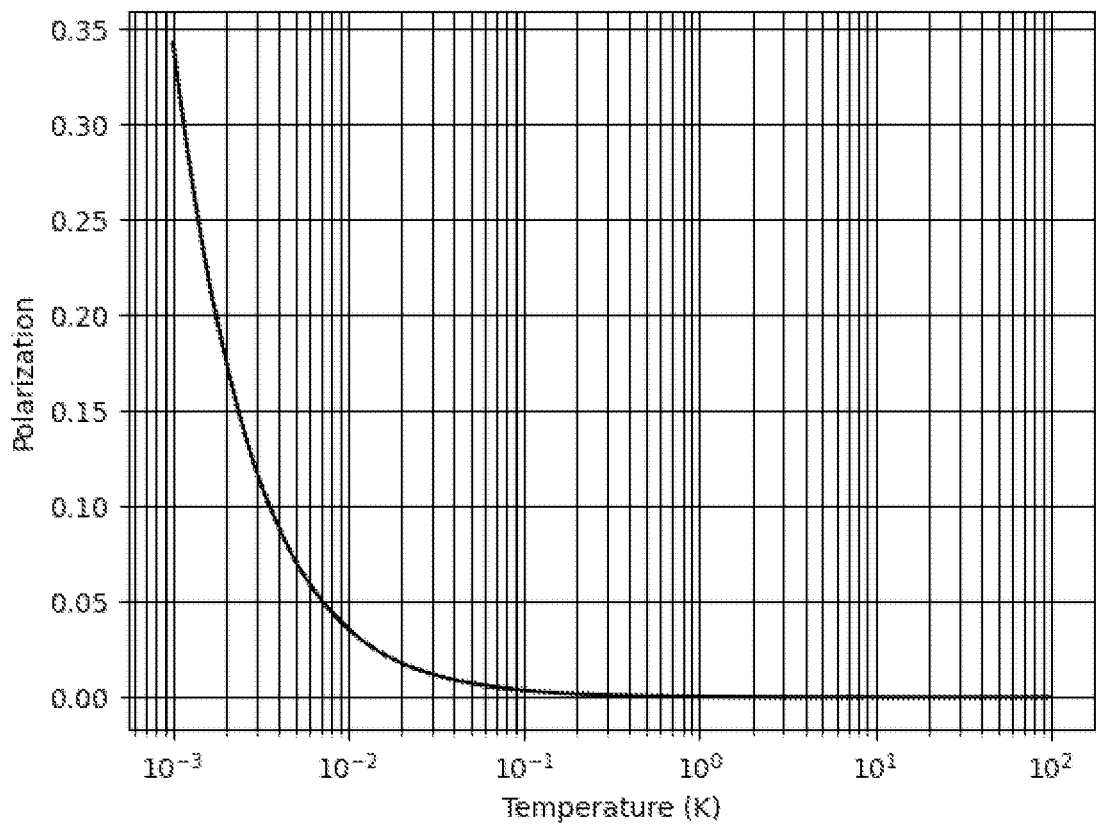
FIG. 1 shows a polarization plot of spin polarization versus temperature.

The magnetization thermal equilibrium distribution is given by $$\frac{N_+ - N_-}{N} = \tanh\left(\frac{\gamma \hbar B_0}{2 K_B T_S}\right)$$

where N is the total number of spins while $N_+$ and $N_-$ are the number of aligned and anti-aligned spins, respectively and γ is the spin gyromagnetic ratio (28.2 GHz/T for electrons and 42.5 MHz/T for protons), h is Planck's constant divided by 2π, $B_0$ is the magnetic field, $K_B$ is the Boltzmann constant and $T_S$ is the spin temperature, as shown in FIG. 1.

If the nuclei or spin temperature can be reduced to 1 Kelvin from room temperature, then the magnetization can be enhanced by a factor of 100 or equivalently the SNR can be increased by this same factor. This then motivates cQED cavity cooling techniques to reduce the spin temperature. The scheme requires resonantly coupling the spins to a resonator or cavity that is at sub-Kelvin cryogenic temperatures to enable removing the excess entropy at the higher spin temperature by accelerating the spontaneous emission process so it exceeds the natural thermal relaxation process in order for the spins to thermalize to the lower resonator or cavity temperature. The spontaneous emission acceleration is achieved through an enhanced coupling of the spins to the resonator or cavity by quantum squeezing.

Figure 2:
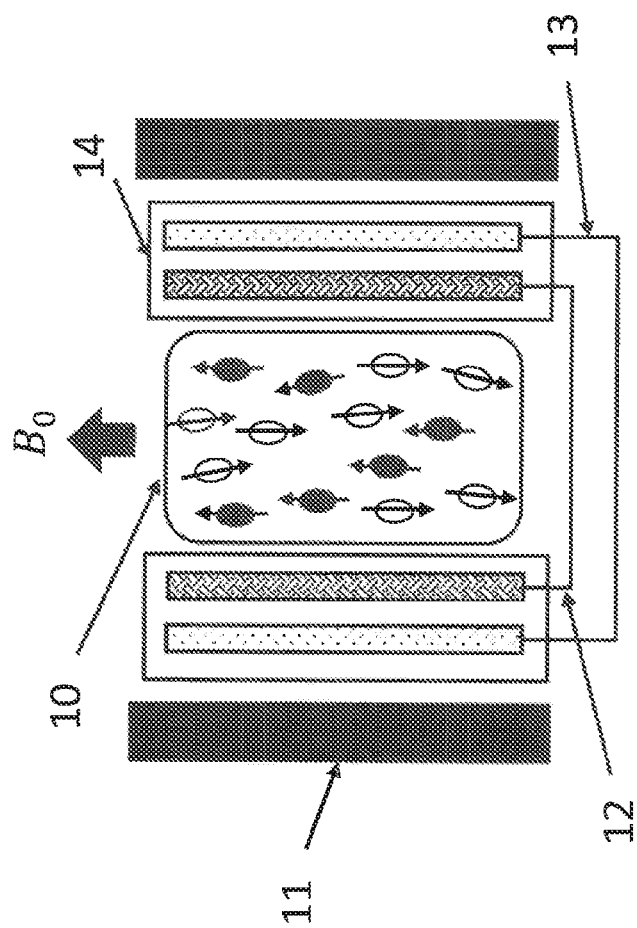
FIG. 2 shows a spin ensemble in a natural thermal distribution state.

FIG. 2 shows a spin ensemble 10, having frequency $\omega_s$, in a static magnetic field ($B_o$) 11 enclosed by a thermally insulated squeezing cavity 12, having frequency $\omega_a$, and a broadband squeezing cavity 13, having frequency $\omega_c$, in a cryogen 14. The spin ensemble 10 is in a natural thermal distribution state.

Figure 3:
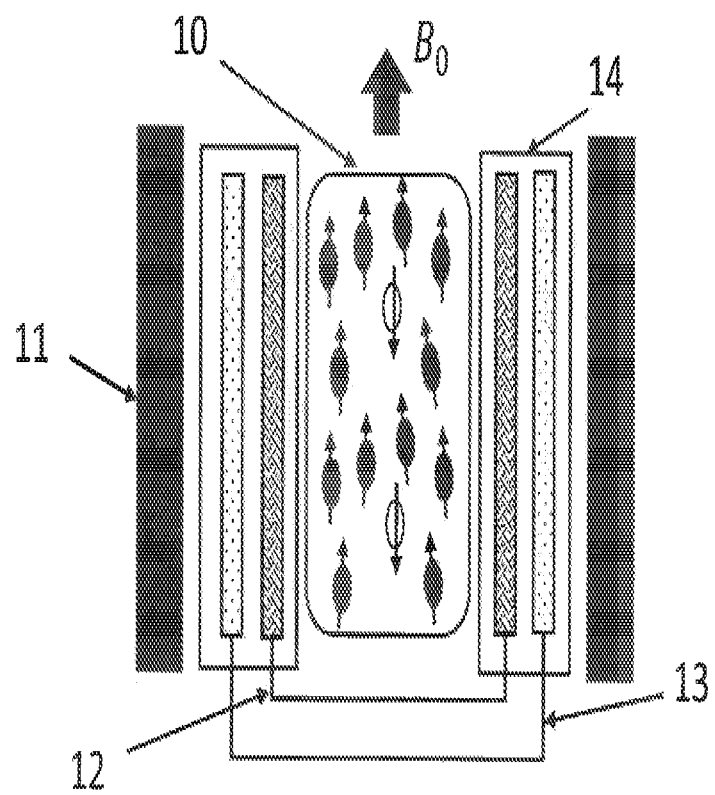
FIG. 3 shows a spin ensemble hyperpolarized after squeezed cooling.

In FIG. 3, the spin ensemble 10 is hyperpolarized after squeezed cooling where the spontaneous emission has overcome the natural thermally relaxed state.

Figure 4:
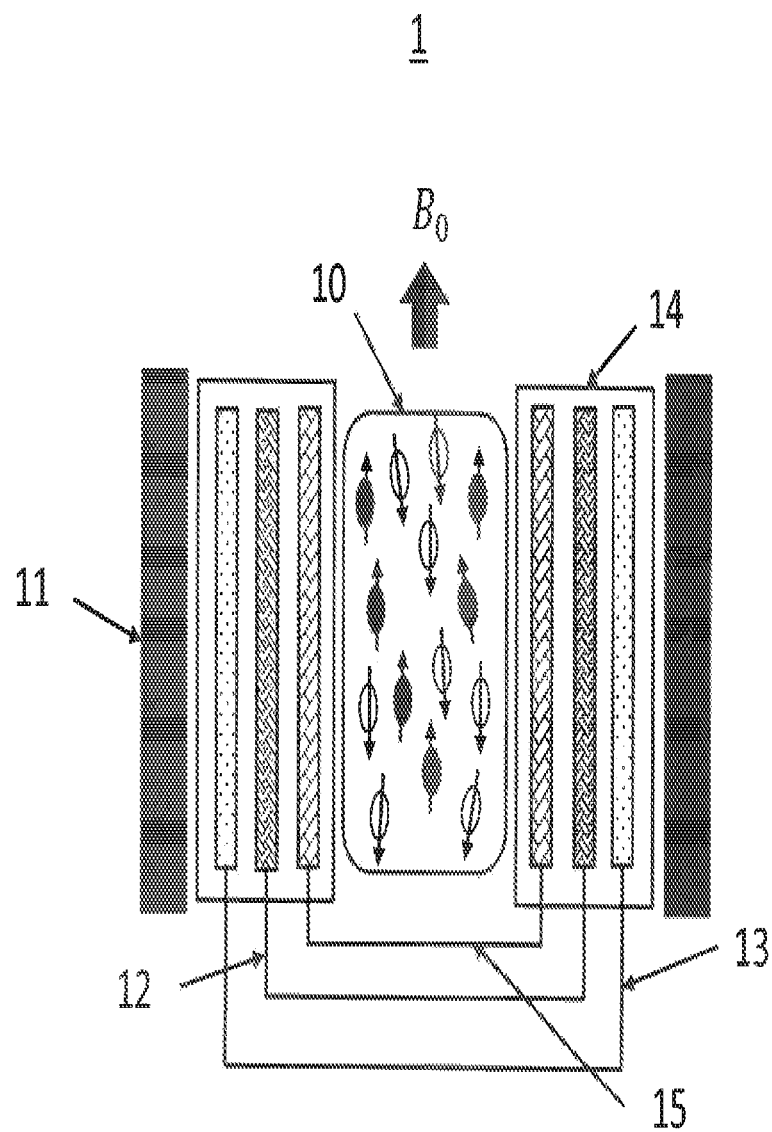
FIG. 4 shows a schematic configuration of a hyperpolarizing system including three distinct cavities that enclose a spin ensemble according to an exemplary embodiment.

Based on the above concept, an exemplary aspect of the present invention is shown in FIG. 4, in which, in a hyperpolarizing system 1, three distinct cavities are thermally separated.

More specifically, the exemplary hyperpolarizing system 1 includes the spin ensemble 10 immersed in a static magnetic field and being subject to hyperpolarization in a cryogen 14, a cold cavity 15, having frequency $\omega_b$, that is at a temperature below a spin temperature of the spin ensemble 10, the spin ensemble 10 being resonantly coupled to the cold cavity 15, a squeezing cavity 12 that is detuned from the cold cavity 15, the squeezing cavity 12 being coupled to the cold cavity 15 and squeezing the cold cavity 15 such that coupling of the cold cavity 15 to the spin ensemble 10 increases to a sufficient strength (ranging from 3 dB to as much as 100 dB) to enable a spontaneous emission process to exceed a spin thermal relaxation process of the spin ensemble 10, and a broadband squeezing cavity 13 coupled to the squeezing cavity 12.

The broadband squeezing cavity 13 may have a same squeezing parameter as the squeezing cavity 12 and being phase-matched with the squeezing cavity 12 such that differences in phase (φ) between the squeezing cavity 12 and the broadband squeezing cavity 13 are integer odd multiples of pi (π) for suppressing or canceling squeezed noise or heat generated by the squeezing cavity 12 as Δφ=nπ; n=±1, ±3, ±5 . . . .

Prior to the resonantly coupling the spin ensemble 10, the cold cavity 15, squeezing cavity 12, and the broadband squeezing cavity 13 are thermally insulated and through cryocooling are maintained, for example, at temperatures between 10 milli-Kelvin and 10 Kelvin.

The hyperpolarization of the spin ensemble 10 is operated at a temperature above the cold cavity and up to a room temperature (e.g., ambient).

The hyperpolarization of the spin ensemble 10 is achieved within a time less than a time of the spin thermal relaxation process of the spin ensemble.

In the squeezing of the cold cavity 15, then the cold cavity 15 couples with the spin ensemble 10 with sufficient strength to enable the spontaneous emission process to exceed the spin thermal relaxation process by increasing a polarization of the spin ensemble 10 more than a thermal equilibrium polarization of the spin ensemble 10.

The coupling of the cold cavity 15 to the squeezing cavity 12 includes quantum squeezing to increase the resonant coupling of the spin ensemble 10 to the cold cavity 15 and reach sufficient strength (3 dB-100 dB) to enable spin cooling.

The quantum squeezing of the cold cavity 15 is implemented by modulating a squeezing cavity resonance frequency.

Figure 5:
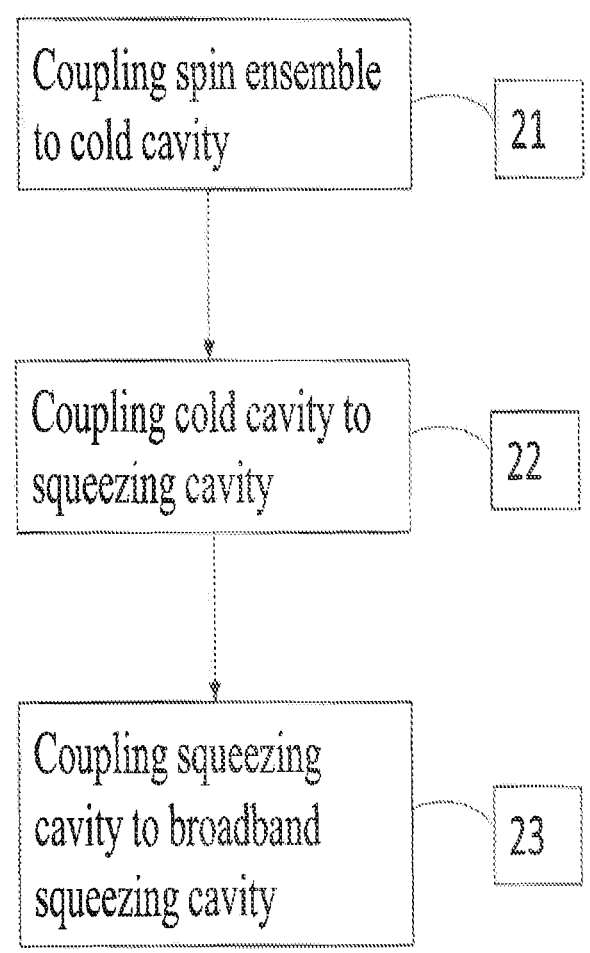
FIG. 5 shows a schematic configuration of a hyperpolarizing method for three distinct cavities according to an exemplary embodiment.

FIG. 5 shows another exemplary aspect of the present invention according to FIG. 4 that is directed to an exemplary method 2 to hyperpolarize the spin ensemble 10.

As shown in FIG. 5, the method 2 includes, in step 21, resonantly coupling the spin ensemble 10 to the cold cavity 15 that is at a temperature below a spin temperature of the spin ensemble 10.

The exemplary method 2 further includes step 22 for coupling the cold cavity 15 to the squeezing cavity 12 that is detuned from the cold cavity 15, the squeezing cavity 12 squeezing the cold cavity 15 such that coupling of the cold cavity 15 to the spin ensemble 10 increases to a sufficient strength (3 dB-100 dB) to enable a spontaneous emission process to exceed a spin thermal relaxation process of the spin ensemble 10.

Finally, in step 23, method 2 includes coupling the squeezing cavity 12 to a broadband squeezing cavity 13 having a same squeezing parameter as the squeezing cavity 12 and being phase-matched with the squeezing cavity 12 for suppressing or canceling squeezed noise or heat generated by the squeezing cavity 12.

It is noted that the above steps are exemplary aspects of the described method 2, and the method can be performed with additional or reduced steps.

Figure 6:
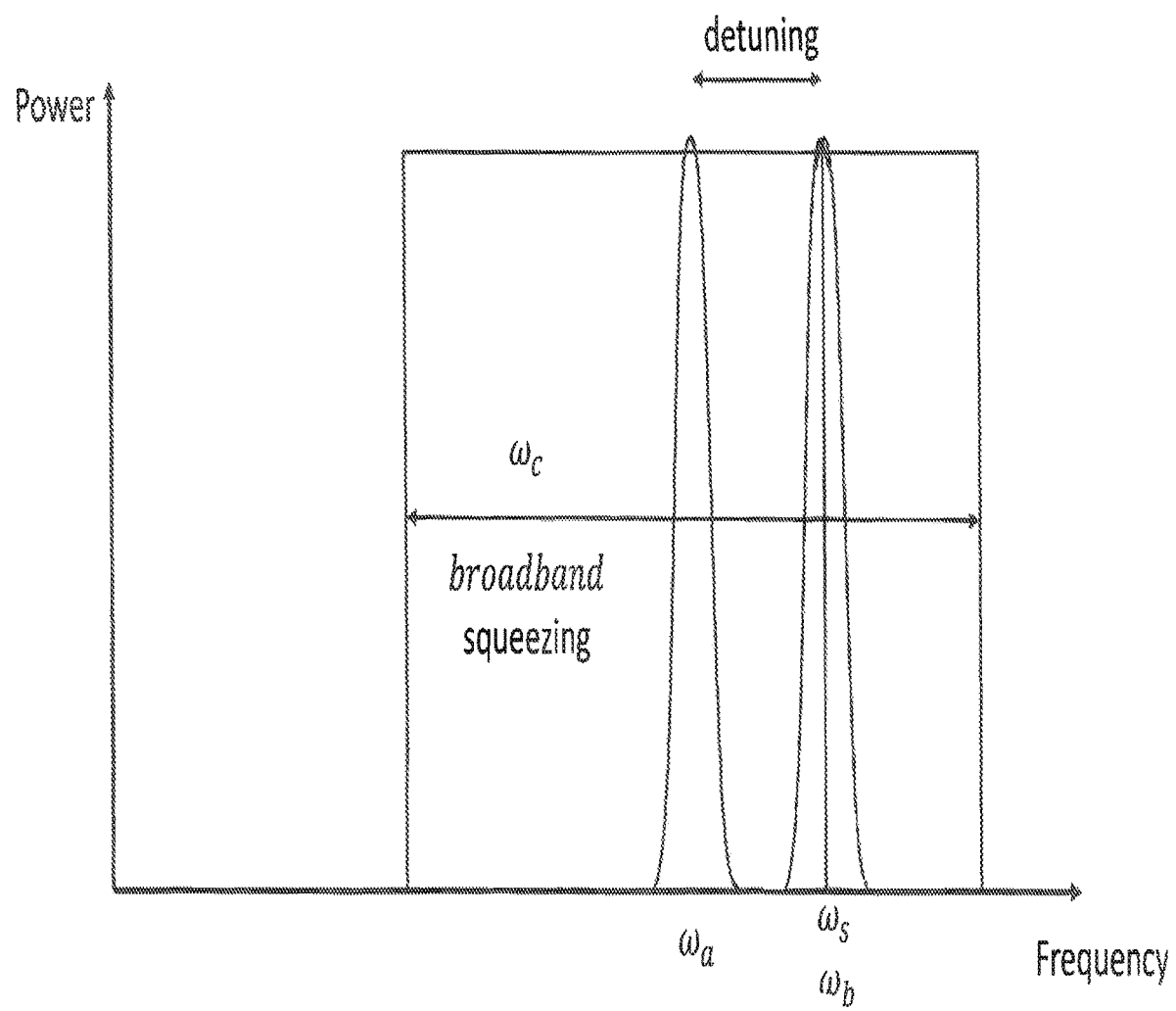
FIG. 6 shows cavity frequency relationships for three distinct cavities according to the exemplary embodiment.

FIG. 6 shows cavity frequency relationships according to the exemplary embodiment demonstrated in the exemplary system 1 shown in FIG. 4.

The power versus frequency plot of FIG. 6 shows the spin ensemble resonance frequency $\omega_s$ in relation to the cold cavity resonance frequency $\omega_b$, the detuned squeezing cavity $\omega_a$, and the broadband squeezing cavity $\omega_c$.

Figure 7:
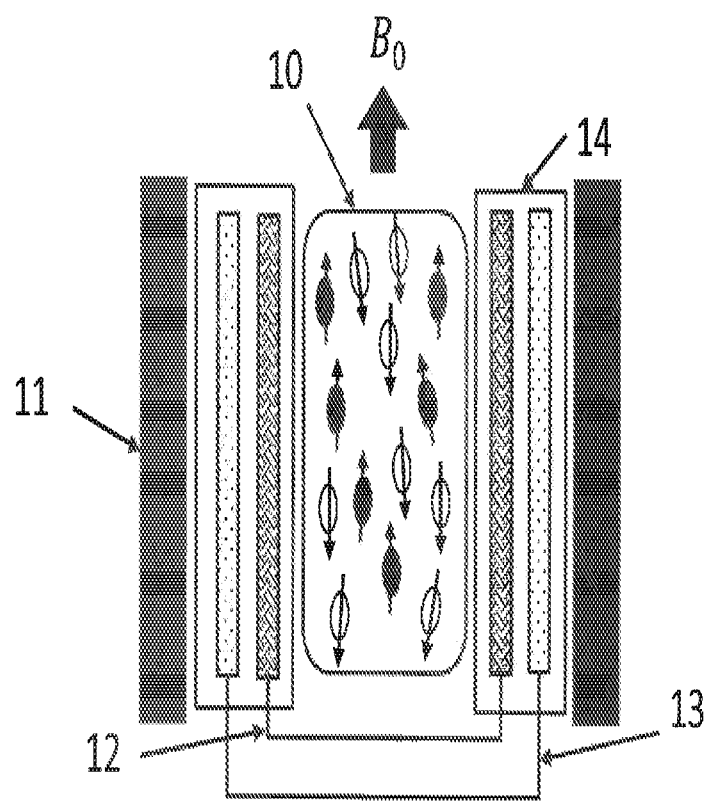
FIG. 7 shows a schematic configuration of a hyperpolarizing system including two distinct cavities that enclose a spin ensemble according to another exemplary embodiment.

Another exemplary aspect of the present invention is shown in FIG. 7, in which, in a hyperpolarizing system 3, two distinct cavities are thermally separated in a cryogen 14 and enclose the spin ensemble 10.

The exemplary system 3 includes a spin ensemble 10 immersed in a static magnetic field, a squeezing cavity 12 held at a temperature below a spin temperature of the spin ensemble 10, the spin ensemble 10 being resonantly coupled to the squeezing cavity 12 to enable a spontaneous emission process to exceed a spin thermal relaxation process of the spin ensemble 10, and a broadband squeezing cavity 13 coupled to the squeezing cavity 12, the broadband squeezing cavity 13 having a same squeezing parameter as the squeezing cavity 12 and being phase-matched with the squeezing cavity 12 for suppressing or canceling squeezed noise or heat generated by the squeezing cavity 12, thereby increasing the polarization of the spin ensemble 10 more than a thermal equilibrium polarization of the spin ensemble 10.

The differences in phase $\Delta\phi$ between the squeezing cavity 12 and the broadband squeezing 13 cavity, for example, are integer odd multiples of pi ($\pi$) as $\Delta\phi = n\pi$; $n = \pm 1, \pm 3, \pm 5 \ldots$.

Prior to the resonantly coupling of the spin ensemble 10, the squeezing cavity 12 and the broadband squeezing cavity 13 are thermally insulated and through cryocooling are maintained, for example, at temperatures between 10 milli-Kelvin and 10 Kelvin.

The hyperpolarization of the spin ensemble 10 is operated at a temperature above the squeezing cavity 12 and up to room temperature (e.g., ambient).

The hyperpolarization of the spin ensemble 10 is achieved within a time less than a time of the spin thermal relaxation process of the spin ensemble.

In the resonantly coupling of the spin ensemble 10 to the squeezing cavity 12, the squeezing cavity 12 squeezes the spin ensemble 10 with sufficient strength to enable the spontaneous emission process to exceed the spin thermal relaxation process by increasing a polarization of the spin ensemble more than a thermal equilibrium polarization of the spin ensemble 10.

Figure 8:
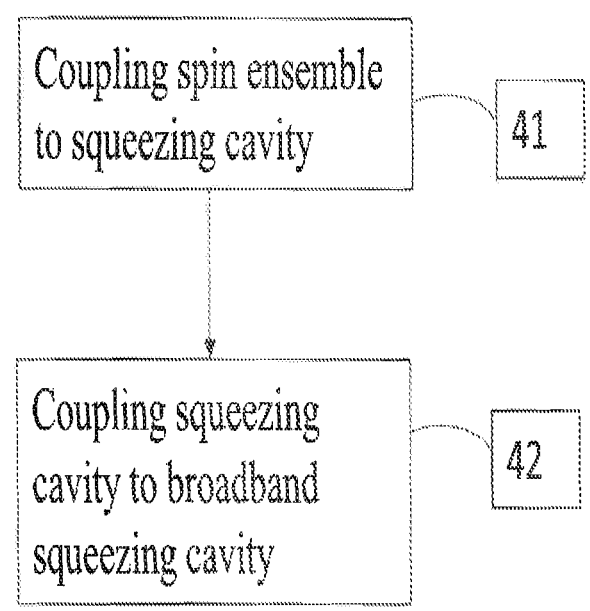
FIG. 8 shows a schematic configuration of a hyperpolarizing method for two distinct cavities according to another exemplary embodiment.

FIG. 8 shows another exemplary aspect of the present invention according to FIG. 7 that is directed to another exemplary method 4 to hyperpolarize the spin ensemble 10.

As shown in FIG. 8, the exemplary method 4 includes, in step 41, resonantly coupling the spin ensemble 10 to the squeezing cavity 12, which is at a temperature below a spin temperature of the spin ensemble 10, to enable a spontaneous emission process to exceed a spin thermal relaxation process of the spin ensemble 10.

Method 4 further includes, in step 42, coupling the squeezing cavity 12 to the broadband squeezing cavity 13 having a same squeezing parameter as the squeezing cavity 12 and being phase-matched with the squeezing cavity 12 for suppressing or canceling squeezed noise or heat generated by the squeezing cavity 12.

It is noted that the above steps are exemplary aspects of the described method 4, and the method can be performed with additional or reduced steps.

Figure 9:
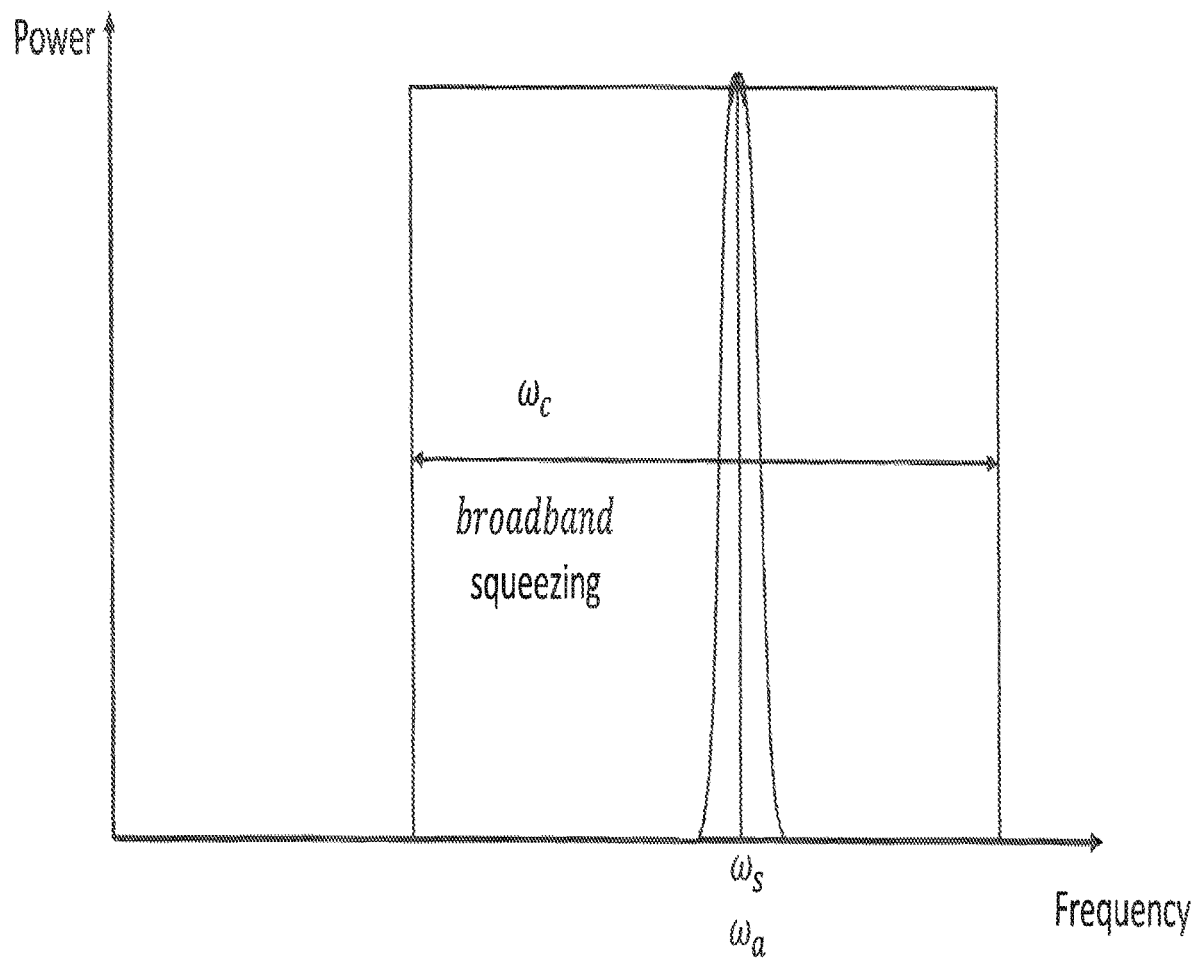
FIG. 9 shows cavity frequency relationships for two distinct cavities according to another exemplary embodiment.

FIG. 9 shows cavity frequency relationships according to another exemplary embodiment demonstrated in the exemplary system 3 shown in FIG. 7.

The power versus frequency plot of FIG. 9 shows the spin ensemble resonance frequency $\omega_s$ in relation to the squeezing cavity $\omega_a$ and the broadband squeezing cavity $\omega_c$.

Based on the exemplary systems 1 and 3 shown in FIGS. 4 and 7, and their cavity frequency relationship demonstrated in FIGS. 6 and 9, respectively, hyperpolarizing systems can be achieved for room temperature polarization in the spin ensemble 10 faster than the typical relaxation times of the spins through non-radiative processes or thermal processes.

In these systems, for example, quantum squeezing is used to enhance the spin ensemble coupling to the cold cavity 15 and enable entropy removal or spin cooling.

The cold cavities adapted to be thermally insulated and through cryocooling maintained at temperatures well below ambient or room temperature. The squeezing cavity 12, the broadband squeezing cavity 13, and the cold cavity 15 are distinct in the hyperpolarizing system 1, and the squeezing cavity 12 and the broadband squeezing cavity 13 are distinct in the hyperpolarizing system 3.

The broadband squeezing cavity 13 eliminates the strong squeezed noise generated inside the squeezing cavity 12 that couples into the cold cavity 15. In the hyperpolarizing system 1, as shown in FIG. 6, the squeezing cavity 12 is detuned from both the spin ensemble 10 and cold cavity 15, while also being coupled to both of these cavities. The cold cavity 15 is resonant with the spin ensemble 10.

The quantum squeezing of the squeezing cavity 12 is implemented by modulating a squeezing cavity resonance frequency.

The squeezing of the squeezing cavity 12 increases coupling of the squeezing cavity 12 to a cryogen 14 or to a cold load, thereby increasing a cooling efficiency.

Exemplary system configuration 1 shown in FIG. 4 enables strong coupling of the spin ensemble 10 to the cold cavity 15 by quantum squeezing. The hyperpolarizing systems 1 and 3 further include coupling in a broadband squeezed noise to eliminate the squeezing cavity 12 induced strong noise.

The technical aspects of the processes in the exemplary systems 1 and 3 discussed above are described in more details in the following section.

Resonator (or Cavity)-Spin Coupling

The quantum mechanical description for the resonator-spin coupling as shown in the above-described systems 1 and 3, shown in FIGS. 4 and 7, respectively, is given by the Jaynes-Cummings model. In this model, the resonator is characterized by a lumped-element LC oscillator whose quantized Hamiltonian is analogous to a quantum harmonic oscillator:

$$H = \frac{\hat{\varphi}^2}{2L} + \frac{\hat{q}^2}{2C}$$

in terms of the flux and charge operators $\hat{\varphi}$ and $\hat{q}$, respectively. As usual $\varphi$=LI and q=CV.

To avoid dealing with quadratic operators, the customary prescription calls for factorizing the Hamiltonian leading to the annihilation and creation operators defined by $$\hat{a} = \frac{1}{\sqrt{2\hbar Z_0}}(\hat{\varphi} + iZ_0\hat{q})$$

$$\hat{a}^+ += \frac{1}{\sqrt{2\hbar Z_0}}(\hat{\varphi} - iZ_0\hat{q})$$

respectively $$Z_0 = \sqrt{\frac{L}{C}}$$

is the impedance and $$\omega_0 = \sqrt{\frac{1}{LC}}$$

is the resonance frequency of the circuit. This enables us to rewrite the harmonic oscillator Hamiltonian in the typical form as:

$$H = \hbar\omega_0\left(\hat{a}^+\hat{a} + \frac{1}{2}\right)$$

where the zero-point energy, $$\frac{1}{2}\hbar\omega_0,$$

is a consequence of the noncommutativity of the operators $[\hat{\varphi}, \hat{q}]=i\hbar$; a central feature common to all quantum systems and the source of the quantum fluctuations key to quantum coupling mechanisms and the invention to be described below.

In the context of electromagnetics, the eigenstates of the above Hamiltonian are known as the Fock (or number) states $\{|n>\}$ and obey:

$$\hat{a}|n\rangle = \sqrt{n}|n-1\rangle$$

$$\hat{a}^+|n\rangle = \sqrt{n+1}|n+1\rangle$$

$$\hat{n} \equiv \hat{a}^+\hat{a} \to \hat{n}|n\rangle = \hat{a}^+\hat{a}|n\rangle = n|n\rangle \to H|n\rangle = \hbar\omega_0\left(n + \frac{1}{2}\right)|n\rangle$$

The lowest energy state (the zero-point energy eigenstate) is known as the vacuum state:

$\hat{a}|0\rangle=0$ from which the number state can be derived recursively as $$|n\rangle = \frac{(\hat{a}^+)^n}{\sqrt{n}}|0\rangle$$

With these definitions, the voltage between the capacitors and the current in the inductors can be quantum mechanically expressed as $$\hat{V} = \frac{\hat{q}}{C} = i\omega_0\sqrt{\frac{\hbar Z_0}{2}}(\hat{a}^+ - \hat{a})$$

$$\hat{I} = \frac{\hat{\varphi}}{L} = \omega_0\sqrt{\frac{\hbar}{2Z_0}}(\hat{a}^+ - \hat{a})$$

Then, the rms vacuum fluctuations of the current and voltage in the resonator ground state can be calculated:

$$\delta I^2 = \langle 0|\hat{I}^2|0\rangle = \frac{\hbar\omega_0^2}{2Z_0}$$

$$\delta V^2 = \langle 0|\hat{V}^2|0\rangle = \frac{\hbar Z_0\omega_0^2}{2}$$

Due to the factor of ~1000 difference between the electron and proton gyromagnetic ratio, electrons couple much more strongly than protons, thereby yielding stronger magnetization and enable efficient cooling. Experiments performed using electron spin resonance exploit this strong coupling to implement cavity cooling. The spin-resonator coupling denoted by g is mediated by the quantum fluctuations of the resonator or cavity. Spins, as shown for example in FIG. 3, have a dipole magnetic moment which in a magnetic field experience a torque and their energy quantum mechanically is expressed through the interaction Hamiltonian H=$-\hat{\mu}\cdot\hat{B}$ where $\hat{\mu}=\gamma\hat{S}$ is the quantized moment arising from the spin angular momentum $\hat{S}=m\hbar\hat{\sigma}$ with eigenvalues m=$\pm\frac{1}{2}$. The "+" eigenvalue is the aligned state while the "−" eigenvalue is the anti-aligned orientation.

The $\hat{\sigma}$s are the Pauli spin operators given by $$\hat{\sigma}_x = \begin{pmatrix} 0 & 1 \\ 1 & 0 \end{pmatrix}, \hat{\sigma}_y = \begin{pmatrix} 0 & -i \\ i & 0 \end{pmatrix} \text{ and } \hat{\sigma}_z = \begin{pmatrix} 1 & 0 \\ 0 & -1 \end{pmatrix}.$$

Spin state raising and lowering operators are defined through $$\hat{\sigma}_\pm = \frac{1}{2}(\hat{\sigma}_x \pm i\hat{\sigma}_y):$$

$$\hat{\sigma}_+ = \begin{pmatrix} 0 & 1 \\ 0 & 0 \end{pmatrix} \text{ and } \hat{\sigma}_- = \begin{pmatrix} 0 & 0 \\ 1 & 0 \end{pmatrix}$$

Since the resonator magnetic field directly depend on the currents flowing through it, $\hat{I}\propto\delta I(\hat{a}^++\hat{a})$, as shown for example in FIG. 3, the spins experience the magnetic field quantum fluctuations of the resonator arising from the zero-point energy as expressed through the current fluctuation $\delta I$. For electrons at GHz frequencies, this is on the order of tens of nA and, for protons at MHz frequencies, this is on the order of sub pA. The corresponding coupling strength is derived from the coupling interaction energy $$H_{int} = -\hat{\mu}\cdot\hat{B} = -\gamma\hat{S}\cdot\delta\hat{B}$$

and in the spin basis $\{|+\rangle, |-\rangle\}$ the coupling strength, g, is given by $$g = \gamma|\langle +|\hat{S}\cdot\delta\hat{B}|-\rangle| = \frac{\gamma}{2}|\delta B|.$$

For a nominal NMR resonant frequency of 100 MHz, we calculate g as follows:

$$g = \gamma|\langle +|\delta\hat{B}\cdot\hat{S}|-\rangle| = \frac{\gamma_p}{2}|\delta B| = \frac{\gamma_p}{2}\frac{\mu_0\delta i}{2\pi f(r)} =$$

$$\frac{\gamma_p}{2}\frac{\mu_0\omega_0}{2\pi f(r)}\sqrt{\frac{\hbar}{2Z_0}}\sqrt{\frac{\hbar}{2Z_0}} = \sqrt{\frac{10^{-34} J\cdot s}{10^2 J\cdot s/C^2}} = 10^{-18}C = 10^{-18}A\cdot s$$

The constants are $$g = \frac{\left(42.58\times\frac{10^6 Hz}{T}\right)\left(4\pi\times\frac{10^{-7}N}{A^2}\right)(2\pi\times 10^8 Hz)}{2(2\pi)(10^{-2}m)}10^{-18}A\cdot s$$

$$g = (2.1)(4\pi\times 10^8)(10^2)(10^{-18}) Hz = 8\pi\cdot 10^{-8}$$

given $$T = \frac{N}{A\cdot m}$$

and we have assumed $f(r)\approx 10^{-2}$m. Therefore, for protons, this is on the order of micro-Hertz. Substituting the electron gyromagnetic ratio and nominal ESR resonant frequency of 10 GHz gives a coupling constant on the order of a milli-Hertz. The regime where radiative processes start to exceed thermal processes is approached when g can reach values of about 1 Hertz and resonator Q-values are in excess of $10^5$. For protons, this implies enhancing g by factors ranging from 3 dB-100 dB depending on operating temperatures and other considerations.

In ESR, by carefully designing experiments where the electrons are as close as possible to the resonator (e.g., within microns so the mode volume is minimized), and using very high Q resonators, a strong enough coupling is established to the resonator and cavity cooling, for example cold cavity 15 in system 1, can be achieved through the Purcell effect: the regime where spontaneous and radiative emissions dominate over thermal processes such as phonon and dipole-dipole interactions that give rise to the Boltzmann distribution. For protons, the coupling is several orders of magnitude weaker and cavity cooling is negligible. However, the quantum fluctuations of the resonator arising from the zero-point energy obey Heisenberg's uncertainty principle:

$$\delta I \delta V = \frac{\hbar}{2}$$

If the current fluctuation can be amplified and the voltage fluctuation proportionally suppressed so their product still obeys Heisenberg's uncertainty principle, then the resonator-spin coupling can be enhanced and reach values whereby cavity cooling, for example cold cavity 15 in system 1, can be enabled. This 'SQUEEZING' or anti-squeezing of the current fluctuation can be implemented through quantum optical techniques developed over the last decade-and-a-half in the new field of cQED.

Quantum Squeezing of an LC Resonator

If the resonator Hamiltonian changes from one set of LC values to another an infinitesimal time later, then the change appears as if the resonator had been squeezed. This motivates how to bring about the necessary squeezing, for example squeezing cavity 12 in system 1, to amplify the ground state current fluctuation. Starting with the original Hamiltonian and a given set of LC parameters a change to a new set implies:

$$H_1 = \frac{\hat{\varphi}^2}{2L_1} + \frac{\hat{q}^2}{2C_1} \xrightarrow{\Delta H} H_2 = \frac{\hat{\varphi}^2}{2L_2} + \frac{\hat{q}^2}{2C_2}$$

$$Z_0^1 = \sqrt{\frac{L_1}{C_1}} \xrightarrow{\Delta} Z_0^2 = \sqrt{\frac{L_2}{C_2}}$$

The associated fluctuations change as follows:

$$\left.\begin{array}{l}\delta\varphi_1 = \sqrt{\frac{\hbar Z_0^1}{2}} \\ \delta q_1 = \sqrt{\frac{\hbar}{2Z_0^1}}\end{array}\right\} \xrightarrow{\Delta} \left\{\begin{array}{l}\sqrt{\frac{Z_0^1}{Z_0^2}}\sqrt{\frac{\hbar Z_0^2}{2}} \equiv e^r\sqrt{\frac{\hbar Z_0^2}{2}} = e^r\delta\varphi_2 \\ \sqrt{\frac{Z_0^2}{Z_0^1}}\sqrt{\frac{\hbar}{2Z_0^2}} \equiv e^{-r}\sqrt{\frac{\hbar}{2Z_0^2}} = e^{-r}\delta q_2\end{array}\right. ; e^r = \sqrt{\frac{Z_0^1}{Z_0^2}}$$

Consequently $e^r$ is the squeezing factor with r as the squeezing parameter. (Note that $\delta\varphi_1\delta q_1 = e^r\delta\Phi_2 e^{-r}\delta q_2 = \delta\varphi_2\delta q_2 = \hbar/2$.) The flux and charge operators change similarly:

$$\left.\begin{array}{l}\hat{\varphi}_1 = \sqrt{\frac{\hbar Z_0^1}{2}}(\hat{a}_1^+ + \hat{a}_1) \\ \hat{q}_1 = -i\sqrt{\frac{\hbar}{2Z_0^1}}(\hat{a}_1^+ - \hat{a}_1)\end{array}\right\} \xrightarrow{\Delta} \begin{array}{l}\hat{\varphi}_2 = \sqrt{\frac{\hbar Z_0^2}{2}}(\hat{a}_2^+ + \hat{a}_2) \\ \hat{q}_2 = -i\sqrt{\frac{\hbar}{2Z_0^2}}(\hat{a}_2^+ - \hat{a}_2)\end{array}$$

In an infinitesimal time $\delta t \ll 1$, the changes are small enough that the operators approximately equal each other. Therefore $$\left.\begin{array}{l}\hat{\varphi}_1 \approx \hat{\varphi}_2 \\ \hat{q}_1 \approx \hat{q}_2\end{array}\right\} \rightarrow \left\{\begin{array}{l}(\hat{a}_1^+ + \hat{a}_1) = \sqrt{\frac{Z_0^2}{Z_0^1}}(\hat{a}_2^+ + \hat{a}_2) = e^{-r}(\hat{a}_2^+ + \hat{a}_2) \\ (\hat{a}_1^+ - \hat{a}_1) = \sqrt{\frac{Z_0^1}{Z_0^2}}(\hat{a}_2^+ - \hat{a}_2) = e^r(\hat{a}_2^+ - \hat{a}_2)\end{array}\right.$$

From this set of equations, the individual operators can be found:

$$\hat{a}_1 = \frac{1}{2}[(e^r + e^{-r})\hat{a}_2 + (e^r - e^{-r})\hat{a}_2^+] = \cosh r\hat{a}_2 + \sinh r\hat{a}_2^+$$

-continued $$\hat{a}_1^+ = \frac{1}{2}[(e^r - e^{-r})\hat{a}_2 + (e^r + e^{-r})\hat{a}_2^+] = \sinh r \hat{a}_2 + \cosh r \hat{a}_2^+$$

$$\hat{a}_2 = \frac{1}{2}[(e^{-r} + e^r)\hat{a}_1 + (e^{-r} - e^r)\hat{a}_1^+] = \cosh r \hat{a}_1 - \sinh r \hat{a}_1^+$$

$$\hat{a}_2^+ = \frac{1}{2}[(e^{-r} - e^r)\hat{a}_1 + (e^{-r} + e^r)\hat{a}_1^+] = -\sinh r \hat{a}_1 + \cosh r \hat{a}_1^+$$

These set of transformations are known as Bogoliubov-Valatin transforms. From the first set of these equations, we can derive the squeezing operator. Operationally, this can be obtained by considering the action of $\hat{a}_1$ on the ground state $|0\rangle_{(1)}$ which can be related to the action of the $\hat{a}_2$ & $\hat{a}_2^+$ operators as follows:

$$\hat{a}_1|0\rangle_{(1)} = 0 \to (\cosh r \, \hat{a}_2 + \sinh r \, \hat{a}_2^+)|0\rangle_{(1)} = 0$$

To obtain the action of $\hat{a}_2$ & $\hat{a}_2^+$ on the vacuum state $|0\rangle_{(1)}$ it can be related to the basis sets $\{|0\rangle_{(2)}\}$ through a power series perturbation expansion:

$$|0\rangle_{(1)} \to C_0|0\rangle_{(2)} + C_2\hat{a}_2^+\hat{a}_2^+|0\rangle_{(2)} +$$

$$C_4\hat{a}_2^+\hat{a}_2^+\hat{a}_2^+\hat{a}_2^+|0\rangle_{(2)} + \ldots \equiv \alpha(r)\exp\left[-\frac{1}{2}f(r)\hat{a}_2^+\hat{a}_2^+\right]|0\rangle_{(2)}$$

where only the even terms are included since the ground state has even symmetry. The power series expansion has a succinct exponential representation in anticipation of the solution. The constants $\alpha(r)$ and $f(r)$ are determined through normalization conditions and the actions of the operators on the exponential expression above:

$$\hat{a}_1|0\rangle_{(1)} = (\cosh r \hat{a}_2 + \sinh r \hat{a}_2^+)|0\rangle_{(1)} =$$

$$\alpha(r)(\cosh r \hat{a}_2 + \sinh r \hat{a}_2^+)\exp\left[-\frac{1}{2}f(r)\hat{a}_2^+\hat{a}_2^+\right]|0\rangle_{(2)} = 0$$

to finally yield $$|0\rangle_{(1)} = \frac{1}{\sqrt{\cosh r}}\exp\left[-\frac{1}{2}\tanh r \hat{a}_2^+\hat{a}_2^+\right]|0\rangle_{(2)}.$$

The operator $$S(r) = \frac{1}{\sqrt{\cosh r}}\exp\left[-\frac{1}{2}\tanh r \hat{a}_2^+\hat{a}_2^+\right]$$

is the squeeze operator which can be recast in the more familiar form $$S(r) = \exp\left[-\frac{r}{2}(\hat{a}_2^+\hat{a}_2^+ - \hat{a}_2\hat{a}_2)\right] \equiv \exp\left[-\frac{r}{2}(\hat{a}_2^{+2} - \hat{a}_2^2)\right]$$

by using the Schwinger disentangling theorem.

Squeezing of a Resonator

In hyperpolarizing systems such as system 1 shown in FIG. 4, in cQED, bilinear or quadratic operators such as needed for the squeeze operator are interactions generated by parametric drives and nonlinear couplings. These types of drives or interactions modify the resonator to an extent where the critical resonance condition required for magnetic resonance is drastically altered. An alternative way to generate the squeeze operator is to modulate the resonance frequency. Therefore, a non-adiabatic or sudden change to the resonator impedance is considered that alternates between a lower impedance and a higher one in such a way that when the squeezing, for example by squeezing cavity 13 in system 1, is achieved, the resonance condition is met.

Starting with the LC resonator Hamiltonian $$H_0 = \frac{\hat{\varphi}^2}{2L_0} + \frac{\hat{q}^2}{2C_0} = \frac{1}{L_0}\left(\frac{\hat{\varphi}^2}{2} + \frac{L_0}{C_0}\frac{\hat{q}^2}{2}\right) = \frac{1}{2L_0}(\hat{\varphi}^2 + Z_0^2\hat{q}^2)$$

at time (t=0) and operators $$\hat{q} = i\sqrt{\frac{\hbar}{2Z_0}}(\hat{a}^+ - \hat{a}) \,\&\, \hat{\varphi} = \sqrt{\frac{\hbar Z_0}{2}}(\hat{a}^+ + \hat{a})$$

as previously defined. When the impedance $Z_0$ is changed suddenly to a new value $Z(t)$, the Hamiltonian is given by, after letting ($\hbar=1$), $$H(t) =$$

$$\frac{1}{2L(t)}[\hat{\varphi}^2 + Z^2(t)\hat{q}^2] = \frac{1}{2L(t)}\left[\left(\frac{Z_0}{2}\right)(\hat{a}^+ + \hat{a})^2 - Z^2(t)\left(\frac{1}{2Z_0}\right)(\hat{a}^+ - \hat{a})^2\right] =$$

$$\frac{1}{4L(t)}\left\{Z_0\left(\hat{a}^{+2} + \hat{a}^+\hat{a} + \hat{a}\hat{a}^+ + \hat{a}^2\right) - \left[\frac{Z^2(t)}{Z_0}\right]\left(\hat{a}^{+2} - \hat{a}^+\hat{a} - \hat{a}\hat{a}^+ + \hat{a}^2\right)\right\} =$$

$$\frac{1}{4L(t)}\left\{\left(Z_0 + \left[\frac{Z^2(t)}{Z_0}\right]\right)(\hat{a}^+\hat{a} + \hat{a}\hat{a}^+) + \left(Z_0 - \left[\frac{Z^2(t)}{Z_0}\right]\right)(\hat{a}^{+2} + \hat{a}^2)\right\} =$$

$$\frac{1}{4L(t)}Z(t)\left\{\left(\left[\frac{Z_0}{Z(t)}\right] + \left[\frac{Z(t)}{Z_0}\right]\right)(\hat{a}^+\hat{a} + \hat{a}\hat{a}^+) + \left(\left[\frac{Z_0}{Z(t)}\right] - \left[\frac{Z(t)}{Z_0}\right]\right)(\hat{a}^{+2} + \hat{a}^2)\right\}$$

H(t) is now in a form to be diagonalized by a Bogoliubov-Valatin transform when the following substitutions are made $$\frac{1}{L(t)}Z(t) = \frac{1}{L(t)}\sqrt{\frac{L(t)}{C(t)}} = \sqrt{\frac{1}{L(t)C(t)}} = \omega(t) \,\&\, r(t) = -\frac{1}{2}\ln\left[\frac{Z(t)}{Z_0}\right]$$

so that $$H(t) = \frac{\omega(t)}{2}\left\{\left[\frac{e^{2r(t)} + e^{-2r(t)}}{2}\right](\hat{a}^+\hat{a} + \hat{a}\hat{a}^+) + \left[\frac{e^{2r(t)} - e^{-2r(t)}}{2}\right](\hat{a}^{+2} + \hat{a}^2)\right\} =$$

$$\frac{\omega(t)}{2}\left\{\cosh[2r(t)](\hat{a}^+\hat{a} + \hat{a}\hat{a}^+) + \sinh[2r(t)](\hat{a}^{+2} + \hat{a}^2)\right\}.$$

The new operators $\{\hat{b}, \hat{b}^+\}$ in the diagonal frame are then expressed as $$B = T^{-1}A \to \begin{bmatrix}\hat{b}(t) \\ \hat{b}^+(t)\end{bmatrix} = \begin{bmatrix}\cosh[r(t)] & -\sinh[r(t)] \\ -\sinh[r(t)] & \cosh[r(t)]\end{bmatrix}\begin{bmatrix}\hat{a} \\ \hat{a}^+\end{bmatrix} =$$

$$\begin{bmatrix}\cosh[r(t)]\hat{a} - \sinh[r(t)]\hat{a}^+ \\ \cosh[r(t)]\hat{a}^+ - \sinh[r(t)]\hat{a}\end{bmatrix} = \begin{bmatrix}S(t)\hat{a}S^+(t) \\ S(t)\hat{a}^+S^+(t)\end{bmatrix}$$

and S(t) is the squeeze operator:

$$S(t) = \exp\left[-\frac{r(t)}{2}\left(\hat{a}^2 - \hat{a}^{+2}\right)\right].$$

Finally, $$H(t) = \frac{\omega(t)}{2}\left[\hat{b}^+(t)\hat{b}(t) + \hat{b}(t)\hat{b}^+(t)\right].$$

This Hamiltonian, in the original frame, can be written as $$S^+(t)H(t)S(t) - iS^+(t)\frac{\partial}{\partial t}S(t) = \frac{\omega(t)}{2}\hat{a}^+\hat{a} + i\dot{r}(t)\left(\hat{a}^2 - \hat{a}^{+2}\right).$$

The time-dependence of the squeezing parameter is $$\dot{r}(t) = -\frac{1}{2}\frac{\partial}{\partial t}\left\{ln\left[\frac{Z(t)}{Z_0}\right]\right\} = -\frac{1}{2}\frac{\dot{Z}(t)}{Z(t)}$$

When the squeezing modulation is turned off, the time-dependence goes to zero and the squeezing parameter reaches its final asymptotic value.

Enhanced Coupling of Spin-Ensembles to a Resonator

In hyperpolarizing systems, such as system 1 shown in FIG. 4, the full Hamiltonian of spins magnetically coupled to a resonator and coherently interacting with it are well described by the Tavis-Cummings model:

$$H_0 = \omega_0 \hat{a}^+ \hat{a} + \frac{\omega_s}{2}\sum_{j=1}^{N}\hat{\sigma}_z^j + \frac{g}{2}\sum_{j=1}^{N}\left(\hat{a}^+\hat{\sigma}_-^j + \hat{a}\hat{\sigma}_+^j\right) + H_E + H_{SE} =$$

$$\omega_0 \hat{a}^+ \hat{a} + \omega_s \hat{J}_z + g\left(\hat{a} + \hat{J}_- + \hat{a}\hat{J}_+\right) + H_E + H_{SE}$$

where N is the number of spins and $\hat{J}_z$ and $\hat{J}_\pm$ represent the collective spin interactions.

The last two terms represent the interaction of the resonator with an external, larger environment such as a cryostat. A standard bosonic environment is assumed and represented by the set of modes $\{\hat{d}_k^+, \hat{d}_k\}$. These interactions are given by $$H_E = \sum_{k=1}^{M} g_k \hat{d}_k^+ \hat{d}_k \quad \& \quad H_{SE} = \sum_{k=1}^{M} g_k \left(\hat{d}_k^+ \hat{a} + \hat{d}_k \hat{a}^+\right).$$

When the resonator is subjected to sudden mode or impedance changes, it is squeezed and the instantaneous Hamiltonian effectively transforms to $$H(t) = S^+(t)H_0 S(t) - iS^+(t)\dot{S}(t) = \omega(t)\hat{a}^+\hat{a} + \omega_s \hat{J}_z + i\dot{r}(t)(\hat{a}^2 - \hat{a}^{+2}) + gS^+(t)(\hat{a}^+ + \hat{a})S(t)\hat{J}_x + H_E + S^+(t)H_{SE}S(t).$$

Note that the resonator is now at the frequency $\omega(t)$ and the term $i\dot{r}(t)(\hat{a}^2 - \hat{a}^{+2})$ is the time-dependent squeezing. When the squeezing modulation is turned off the time-dependence goes to zero and the squeezing parameter has reached its final asymptotic value. With the relations $$\begin{bmatrix} S^+(t)\hat{a}S(t) \\ S^+(t)\hat{a}^+ S(t) \end{bmatrix} = \begin{bmatrix} \cosh[r(t)]\hat{a} + \sinh[r(t)]\hat{a}^+ \\ \cosh[r(t)]\hat{a}^+ + \sinh[r(t)]\hat{a} \end{bmatrix}$$

the field operators $(\hat{a}^+ + \hat{a})$ in the Hamiltonian transform to $$S^+(t)(\hat{a}^+ + \hat{a})S(t) = \cosh[r(t)]\hat{a}^+ + \sinh[r(t)]\hat{a} + \cosh[r(t)]\hat{a} + \sinh[r(t)]\hat{a}^+ = e^{r(t)}(\hat{a}^+ + \hat{a}).$$

Plugging this into the Hamiltonian results in $$H(t) = \omega(t)\hat{a}^+\hat{a} + \omega_s \hat{J}_z + ge^{r(t)}(\hat{a}^+ + \hat{a})\hat{J}_x + H_E + H_{SE}(t)$$

revealing the exponentially enhanced spin-resonator coupling. The resonator-environment interaction is also enhanced as $$H_{SE}(t) = S^+(t)H_{SE}S(t) = \sum_{k=1}^{M} g_k \left[\hat{d}_k^+ S^+(t)\hat{a}S(t) + \hat{d}_k S^+(t)\hat{a}^+ S(t)\right] =$$

$$\sum_{k=1}^{M} g_k \left\{\hat{d}_k^+ \left[\cosh[r(t)]\hat{a} + \sinh[r(t)]\hat{a}^+\right] + \hat{d}_k\left[\cosh[r(t)]\hat{a}^+ + \sinh[r(t)]\hat{a}\right]\right\} =$$

$$\sum_{k=1}^{M} g_k \left\{\hat{d}_k^+ \left[\left(\frac{e^{r(t)} + e^{-r(t)}}{2}\right)\hat{a} + \left(\frac{e^{r(t)} - e^{-r(t)}}{2}\right)\hat{a}^+\right]\right\} +$$

$$\hat{d}_k \left[\left(\frac{e^{r(t)} + e^{-r(t)}}{2}\right)\hat{a}^+ + \left(\frac{e^{r(t)} - e^{-r(t)}}{2}\right)\hat{a}\right] =$$

$$\frac{e^{r(t)}}{2}(\hat{a}^+ + \hat{a})\sum_{k=1}^{M} g_k \left(\hat{d}_k^+ + \hat{d}_k\right) - \frac{e^{-r(t)}}{2}(\hat{a}^+ + \hat{a})\sum_{k=1}^{M} g_k \left(\hat{d}_k^+ + \hat{d}_k\right).$$

Finally, after dropping the last term because it is exponentially suppressed $$H_{SE}(t) = \frac{e^{r(t)}}{2}(\hat{a}^+ + \hat{a})\sum_{k=1}^{M} g_k \left(\hat{d}_k^+ + \hat{d}_k\right).$$

Therefore, squeezing the resonator through a sudden change in its mode or impedance does enhance the spin-resonator coupling, for example by squeezing cavity 12 in system 1 shown in FIG. 4 as well as the resonator-environment coupling.

Dissipative Squeezing

As discussed above, by minimizing the mode volume and increasing the Q-factor of resonators, researchers have been successful at achieving strong spin-resonator coupling whereby the radiative relaxation dominates thermal relaxation mechanisms.

In the present invention, an exemplary object is to enhance the resonator coupling through squeezing, as shown for example in systems 1 and 3, and to reach regimes where the radiative processes dominate the thermal relaxation interactions.

The dissipative evolution of the hyperpolarizing systems, such as above-mentioned systems 1 and 3, without the broadband squeezing cavities 13, is governed by the Master equation and it is assumed to be Markovian so that the environment, be it the cryogen 14 or the molecular environment of the spin ensemble 10, is memory-less, and it does not influence the system. In the standard prescription of dissipative evolution, the full density matrix (the state of the system) is given by:

$$\rho = \rho_\sigma \otimes \rho_c \otimes \rho_R$$

where, $\rho_\sigma$ is the density matrix for the spins (e.g., such as spin ensemble 10), $\rho_c$ the cavity or resonator (e.g., such as squeezing cavity 12) and $\rho_R$ the reservoir or environment (e.g., such as cryogen 14). $\rho$ is initially assumed to be factorizable and the three subsystems are represented as being in a simple tensor product state. The Master equation is derived by moving into the triply rotating interaction frame of the system-environment and then tracing away the environment (reservoir) degrees-of-freedom:

$$\rho_s = \rho_a \otimes \rho_c = Tr_R\{\rho\} = Tr_R\{\rho_a \otimes \rho_c \otimes \rho_R\}.$$

This is obtained as follows. First, the dynamics of the system is given by the Liouville-von Neuman equation:

$$i\hbar \frac{\partial}{\partial t} \rho = [H(t), \rho].$$

The interaction frame transformation is implemented by the unitary-similarity transform:

$$U' = e^{i/\hbar H' t}$$

where H' is a triply rotating frame $$H' = \omega(t)\hat{a}^+\hat{a} + \omega_s \hat{J}_z + \sum_{k=1}^{M} g_k \hat{d}_k^+ \hat{d}_k.$$

In the new frame we get $$i\hbar \frac{\partial}{\partial t} \tilde{\rho} = [\tilde{H}(t) - H', \tilde{\rho}].$$

The transformed Hamiltonian is $$\tilde{H}(t) - H' = ge^{r(t)} e^{i\omega(t)\hat{a}^+\hat{a}t}(\hat{a}^+ + \hat{a})e^{-i\omega(t)\hat{a}^+\hat{a}t} e^{i\omega_s \hat{J}_z t} \hat{J}_x e^{-i\omega_s \hat{J}_z t} +$$

$$\frac{e^{r(t)}}{2} e^{i\omega(t)\hat{a}^+\hat{a}t}(\hat{a}^+ + \hat{a})e^{-i\omega(t)\hat{a}^+\hat{a}t} \sum_{k=1}^{M} e^{it\Sigma_{j=1}^{L} g_j \hat{d}_j^+ \hat{d}_j} (\hat{d}_k^+ + \hat{d}_k) e^{-it\Sigma_{j=1}^{L} g_j \hat{d}_j^+ \hat{d}_j}.$$

Using the properties:

$$e^{i\omega_s \hat{J}_z t} \hat{J}_x e^{-i\omega_s \hat{J}_z t} = e^{i\omega_s \hat{J}_z t}(\hat{J}_+ + \hat{J}_-)e^{-i\omega_s \hat{J}_z t} = (\hat{J}_+ e^{-\omega_s t} + \hat{J}_- e^{i\omega_s t})$$

$$e^{i\omega(t)\hat{a}^+\hat{a}t}(\hat{a}^+ + \hat{a})e^{-i\omega(t)\hat{a}^+\hat{a}t} = [\hat{a}^+ e^{-\omega(t)t} + \hat{a} e^{i\omega(t)t}]$$

and for the reservoir term $$e^{it\Sigma_{j=1}^{L} g_j \hat{d}_j^+ \hat{d}_j}(\hat{d}_k^+ + \hat{d}_k)$$

$$e^{-it\Sigma_{j=1}^{L} g_j \hat{d}_j^+ \hat{d}_j} = \left[\hat{d}_k^+ e^{-it\Sigma_{j=1}^{L} g_j \delta(j-k)} + \hat{d}_k e^{it\Sigma_{j=1}^{L} g_j \delta(j-k)}\right] = \hat{d}_k^+ e^{-ig_k t} + \hat{d}_k e^{ig_k t}$$

the interaction Hamiltonian can be written as (only keeping the energy conserving or flip-flop terms)

$$\tilde{H}(t) - H' = ge^{r(t)}[\hat{a}^+ e^{-i\omega(t)t} + \hat{a}e^{i\omega(t)t}](\hat{J}_+ e^{-i\omega_s t} + \hat{J}_- e^{i\omega_s t}) +$$

$$\frac{e^{r(t)}}{2}[\hat{a}^+ e^{-i\omega(t)t} + \hat{a} e^{i\omega(t)t}] \sum_{k=1}^{M} g_k(\hat{d}_k^+ e^{-ig_k t} + \hat{d}_k e^{ig_k t}) =$$

$$ge^{r(t)}[\hat{a} + \hat{J}_- e^{i\Delta t} + \hat{a}\hat{J}_+ e^{-i\Delta t}] + \frac{e^{r(t)}}{2} \sum_{k=1}^{M} g_k(\hat{d}_k^+ \hat{a} e^{-i\nu_k t} + \hat{d}_k \hat{a}^+ e^{i\nu_k t}).$$

Note that fast terms (rotating-wave approximation (RWA)) have been dropped.

The difference frequencies that remain are $$\Delta = \omega_s - \omega(t) \ \& \ \nu_k = g_k - \omega(t).$$

As is usual, the dynamical equation in the interaction frame can be integrated to second order, the reservoir traced away, the environment correlation functions calculated and leave for the reservoir portion a Lindblad form for the dynamics:

$$\frac{\partial}{\partial t} \tilde{\rho}_s =$$

$$-ige^{r(t)}[\hat{a} + \hat{J}_- e^{i\Delta t} + \hat{a}\hat{J}_+ e^{-i\Delta t}, \tilde{\rho}_s] + \kappa e^{2r(t)}[2\hat{a}\tilde{\rho}_s \hat{a}^+ - \hat{a}^+\hat{a}\tilde{\rho}_s - \tilde{\rho}_s \hat{a}^+\hat{a}].$$

Having removed the reservoir degrees-of-freedom, we now focus on removing the cavity or resonator from the dynamics (sometimes called "adiabatic elimination of the cavity"), so we get the final Master equation for the reduced spin operators. In the 'bad cavity' limit (e.g., the regime where $\kappa \gg g$), the cavity losses are greater than the coherent dynamics of the spins, and the spins irreversibly lose energy to the reservoir.

Further, given that the Lindbladian ($2\hat{a}\tilde{\rho}_s\hat{a} - \hat{a}^+\hat{a}\tilde{\rho}_s - \tilde{\rho}_s\hat{a}^+\hat{a}$) makes calculations cumbersome, the complexity can be reduced by vectorizing the density matrix or working with superoperators $$\frac{\partial}{\partial t} \hat{\tilde{\rho}}_s = \Lambda(t)\hat{\tilde{\rho}}_s = (\mathcal{L} + \mathcal{D}_c)\hat{\tilde{\rho}}_s$$

$$\mathcal{L} = -i[\hat{I} \otimes H - H^T \otimes \hat{I}] \ \& \ \mathcal{D}_c = \kappa'\left[(\hat{a}^+)^T \otimes \hat{a} - \frac{1}{2}\hat{I} \otimes \hat{a}^+\hat{a} - \frac{1}{2}(\hat{a}^+\hat{a})^T \otimes \hat{I}\right]$$

with $$H = ge^{r(t)}[\hat{a}^+\hat{J}_- e^{i\Delta t} + \hat{a}\hat{J}_+ e^{-i\Delta t}] \kappa' = \kappa e^{2r(t)}.$$

Removing the cavity implies transforming to the dissipator frame of the cavity $$\hat{\tilde{\rho}}'_s = e^{-\mathcal{D}_c t}\hat{\tilde{\rho}}_s \rightarrow \mathcal{L}(t) = e^{-\mathcal{D}_c t}\mathcal{L}(t)e^{\mathcal{D}_c t}$$

so $$\frac{\partial}{\partial t}\hat{\tilde{\rho}}'_s = \mathcal{L}(t)\hat{\tilde{\rho}}'_s$$

since $$\frac{\partial}{\partial t}\hat{\tilde{\rho}}'_s = \frac{\partial}{\partial t}\left(e^{-\mathcal{D}_c t}\hat{\tilde{\rho}}_s\right) =$$

$$-\mathcal{D}_c e^{-\mathcal{D}_c t}\hat{\tilde{\rho}}_s + e^{-\mathcal{D}_c t}\frac{\partial}{\partial t}\hat{\tilde{\rho}}_s = -\mathcal{D}_c\hat{\tilde{\rho}}'_s + e^{-\mathcal{D}_c t}(\mathcal{L} + \mathcal{D}_c)e^{\mathcal{D}_c t}e^{-\mathcal{D}_c t}\hat{\tilde{\rho}}_s.$$

A standard method for eliminating the cavity dynamics is to use projection techniques. Accordingly $$\frac{\partial}{\partial t}\hat{\tilde{\rho}}'_s = \mathcal{L}(t)\hat{\tilde{\rho}}'_s \rightarrow \frac{\partial}{\partial t}\wp\hat{\tilde{\rho}}'_s = \wp\mathcal{L}(t)\hat{\tilde{\rho}}'_s$$

where $\wp[\ ] \to \rho_c \text{Tr}_e[\ ]$ and the equation above can be cast in the following integro-differential form:

$$\frac{d}{dt}\wp\hat{\tilde{\rho}}'_s = \int_0^\infty du\, \wp\tilde{\mathcal{L}}(t)\tilde{\mathcal{L}}(t-u)\wp\hat{\tilde{\rho}}'_s(t).$$

To return to the original interaction frame, we first consider the reduced density matrix under the projection operation:

$$\wp\hat{\tilde{\rho}}'_s(t) = \rho_c \text{Tr}_c[e^{-\mathcal{D}_c^+ t}\hat{\tilde{\rho}}_s(t)] = \text{Tr}_c[e^{-\mathcal{D}_c^+ t}[\hat{I}]\hat{\tilde{\rho}}_s(t)]\otimes\rho_c.$$

Here, we invoked quantum channels and their adjoint properties. Since $\mathcal{D}_c^+[\hat{I}]=0$ $$e^{-\mathcal{D}_c^+ t}[\hat{I}] = \hat{I} \to \text{Tr}_c[e^{-\mathcal{D}_c^+ t}[\hat{I}]\hat{\tilde{\rho}}_s(t)]\otimes\rho_c = \hat{\tilde{\rho}}_s(t)\otimes\rho_c.$$

This allows us to write $$\frac{d}{dt}\hat{\tilde{\rho}}_s(t)\rho_c = \int_0^\infty du\, \wp\tilde{\mathcal{L}}(t)\tilde{\mathcal{L}}(t-u)\hat{\tilde{\rho}}_s(t)\rho_c.$$

Considering the integrand:

$$\wp\tilde{\mathcal{L}}(t)\tilde{\mathcal{L}}(t-u)\hat{\tilde{\rho}}_s(t)\rho_c = \rho_c \text{Tr}_c\left[\tilde{\mathcal{L}}(t)\tilde{\mathcal{L}}(t-u)\hat{\tilde{\rho}}_s(t)\rho_c\right]$$

$$= \text{Tr}_c\left[e^{-\mathcal{D}_c t}\mathcal{L}(t)e^{\mathcal{D}_c t}e^{-\mathcal{D}_c(t-u)}\mathcal{L}(t-u)e^{\mathcal{D}_c(t-u)}\hat{\tilde{\rho}}_s(t)\rho_c\right]\rho_c$$

$$= \text{Tr}_c\left[e^{-\mathcal{D}_c t}\mathcal{L}(t)e^{\mathcal{D}_c u}\mathcal{L}(t-u)e^{\mathcal{D}_c(t-u)}\hat{\tilde{\rho}}_s(t)\rho_c\right]\rho_c.$$

The dissipator acting on the density matrix will become $$\text{Tr}_c\left[e^{-\mathcal{D}_c t}\mathcal{L}(t)e^{\mathcal{D}_c u}\mathcal{L}(t-u)e^{\mathcal{D}_c(t-u)}\left(\hat{\tilde{\rho}}_s(t)\rho_c\right)\right]\rho_c$$

$$= \text{Tr}_c\left[e^{-\mathcal{D}_c t}\mathcal{L}(t)e^{\mathcal{D}_c u}\mathcal{L}(t-u)e^{\mathcal{D}_c^+(t-u)}[\hat{I}]\hat{\tilde{\rho}}_s(t)\rho_c\right]\rho_c$$

$$= \text{Tr}_c\left[e^{-\mathcal{D}_c t}\mathcal{L}(t)e^{\mathcal{D}_c u}\mathcal{L}(t-u)\hat{\tilde{\rho}}_s(t)\rho_c\right]\rho_c$$

and further continuing this procedure $$\text{Tr}_c\left[e^{-\mathcal{D}_c t}\mathcal{L}(t)e^{\mathcal{D}_c u}\mathcal{L}(t-u)\hat{\tilde{\rho}}_s(t)\rho_c\right]\rho_c = \text{Tr}_c\left[\mathcal{L}(t)e^{\mathcal{D}_c u}\mathcal{L}(t-u)\hat{\tilde{\rho}}_s(t)\rho_c e^{-\mathcal{D}_c t}\right]\rho_c$$

$$= \text{Tr}_c\left[\mathcal{L}(t)e^{\mathcal{D}_c u}\mathcal{L}(t-u)e^{-\mathcal{D}_c^+ t}\left(\hat{\tilde{\rho}}_s(t)\rho_c\right)\right]\rho_c$$

$$= \text{Tr}_c\left[\mathcal{L}(t)e^{\mathcal{D}_c u}\mathcal{L}(t-u)e^{-\mathcal{D}_c^+ t}[\hat{I}]\hat{\tilde{\rho}}_s(t)\rho_c\right]\rho_c$$

$$= \text{Tr}_c\left[\mathcal{L}(t)e^{\mathcal{D}_c u}\mathcal{L}(t-u)\hat{\tilde{\rho}}_s(t)\rho_c\right]\rho_c$$

where the cyclic property of the trace operation was repeatedly used. Finally, the action of the dissipator on the Liouvillian becomes, following similar procedures $$\text{Tr}_c[\mathcal{L}(t)e^{\mathcal{D}_c u}\mathcal{L}(t-u)\hat{\tilde{\rho}}_s(t)\rho_c]\rho_c = \text{Tr}_c[e^{-\mathcal{D}_c^+ u}(\mathcal{L}(t))\mathcal{L}(t-u)\hat{\tilde{\rho}}_s(t)\rho_c]\rho_c = \text{Tr}_c([e^{-\kappa' u/2}\mathcal{L}(t)\mathcal{L}(t-u)\hat{\tilde{\rho}}_s(t)\rho_c]\rho_c$$

since $$\mathcal{D}_c^+[\hat{a}] = -\frac{\kappa'}{2}\hat{a} \ \& \ \mathcal{D}_c^+[\hat{a}^+] = -\frac{\kappa'}{2}\hat{a}^+$$

The integro-differential equation will then take the form $$\frac{d}{dt}\hat{\tilde{\rho}}_s(t)\rho_c = \int_0^\infty du\, \wp\tilde{\mathcal{L}}(t)\tilde{\mathcal{L}}(t-u)\hat{\tilde{\rho}}_s(t)\rho_c$$

$$= \int_0^\infty du\, \text{Tr}_c\left[e^{-\kappa' u/2}\mathcal{L}(t)\mathcal{L}(t-u)\hat{\tilde{\rho}}_s(t)\rho_c\right]\rho_c.$$

After expanding the superoperators, it becomes $$\frac{d}{dt}\tilde{\rho}_\sigma(t) = -\int_0^\infty du\, e^{-\frac{\kappa' u}{2}} \text{Tr}_c\{[H(t),[H(t-u),\tilde{\rho}_\sigma(t)\tilde{\rho}_c]]\}.$$

To solve this equation, we start by expanding the integrand:

$$\frac{d}{dt}\tilde{\rho}_\sigma(t) = -\int_0^\infty du\, e^{-\frac{\kappa' u}{2}} \text{Tr}_c\{[H(t),[H(t-u),\tilde{\rho}_\sigma(t)\tilde{\rho}_c]]\}$$

$$= -\int_0^\infty du\, e^{-\frac{\kappa' u}{2}} \text{Tr}_c\{[H(t),[H(t-u)\tilde{\rho}_\sigma(t)\tilde{\rho}_c - \tilde{\rho}_\sigma(t)\tilde{\rho}_c H(t-u)]]\}$$

$$= -\int_0^\infty du\, e^{-\frac{\kappa' u}{2}} \text{Tr}_c\{H(t)H(t-u)\tilde{\rho}_\sigma(t)\tilde{\rho}_c - H(t)\tilde{\rho}_\sigma(t)\tilde{\rho}_c H(t-u)$$

$$-H(t-u)\tilde{\rho}_\sigma(t)\tilde{\rho}_c H(t) + \tilde{\rho}_\sigma(t)\tilde{\rho}_c H(t-u)H(t)\}.$$

In the Hamiltonian $$H(t) = g e^{r(t)}[\hat{a}^+ \hat{J}_- e^{i\Delta t} + \hat{a}_+ e^{-i\Delta t}]$$

we define $\gamma = g e^{r(t)}$ and recalling $\Delta = \omega_s - \omega(t) = 0$ (i.e. resonance) let $$A(t) = \hat{a} e^{-i\Delta t} \ \& \ A^+(t) = \hat{a}^+ e^{i\Delta t}$$

$$A(t-u) = \hat{a} e^{-i\Delta(t-u)} = A(t) e^{i\Delta u} \ \& \ A^+(t-u) = \hat{a}^+ e^{i\Delta(t-u)} = A^+(t) e^{-i\Delta u}$$

so, the following terms in the integrand can be obtained:

$$\gamma \int_0^\infty du\, e^{-\frac{\kappa' u}{2}} \text{Tr}_c$$

$$\left\{-\left[\sum_{\alpha\beta,\beta\alpha} A_\alpha(t) J_\beta\right]\left[\sum_{\alpha\beta,\beta\alpha} A_\alpha(t-u) J_\beta\right]\tilde{\rho}_\sigma(t)\tilde{\rho}_c + \left[\sum_{\alpha\beta,\beta\alpha} A_\alpha(t) J_\beta\right]\tilde{\rho}_\sigma(t)\right.$$

$$\left.\tilde{\rho}_c\left[\sum_{\alpha\beta,\beta\alpha} A_\alpha(t-u) J_\beta\right] - \left[\sum_{\alpha\beta,\beta\alpha} A_\alpha(t-u) J_\beta\right]\tilde{\rho}_\sigma(t)\tilde{\rho}_c\left[\sum_{\alpha\beta,\beta\alpha} A_\alpha(t) J_\beta\right] + \right.$$

$$\tilde{\rho}_\sigma(t)\tilde{\rho}_c\left[\sum_{\alpha\beta,\beta\alpha}A_\alpha(t-u)J_\beta\right]\left[\sum_{\alpha\beta,\beta\alpha}A_\alpha(t)J_\beta\right]\right\}$$

where $$A_\alpha(t)=A^+(t) \ \& \ A^\beta(t)=A(t)$$

$$J_\beta=\hat{J}_- \ \& \ J_\alpha=\hat{J}_+$$

$$\sum_{\alpha\beta,\beta\alpha}A_\alpha(t)J_\beta \equiv A_\alpha(t)J_\beta + A_\beta(t)\hat{J}_\alpha = A^+(t)\hat{J}_- + A(t)\hat{J}_+$$

These terms are further expanded as follows:

$$\frac{d}{dt}\tilde{\rho}_\sigma(t) = -\gamma\left[\sum_{\substack{\beta\beta,\beta\alpha,\alpha\beta,\alpha\alpha \\ \alpha\alpha,\alpha\beta,\beta\alpha,\beta\beta}}J_\beta J_\beta\tilde{\rho}_\sigma(t)\mathcal{M}_{\alpha\alpha}\right]+\gamma\left[\sum_{\substack{\beta\beta,\beta\alpha,\alpha\beta,\alpha\alpha \\ \alpha\alpha,\alpha\beta,\beta\alpha,\beta\beta}}J_\beta\tilde{\rho}_\sigma(t)J_\beta\mathcal{N}_{\alpha\alpha}\right]-$$

$$\gamma\left[\sum_{\substack{\beta\beta,\beta\alpha,\alpha\beta,\alpha\alpha \\ \alpha\alpha,\alpha\beta,\beta\alpha,\beta\beta}}J_\beta\tilde{\rho}_\sigma(t)J_\beta\mathcal{N}^*_{\alpha\alpha}\right]+\gamma\left[\sum_{\substack{\beta\beta,\beta\alpha,\alpha\beta,\alpha\alpha \\ \alpha\alpha,\alpha\beta,\beta\alpha,\beta\beta}}J_\beta J_\beta\tilde{\rho}_\sigma(t)\mathcal{M}^*_{\alpha\alpha}\right]$$

where terms are defined as $$\sum_{\substack{\beta\beta,\beta\alpha,\alpha\beta,\alpha\alpha \\ \alpha\alpha,\alpha\beta,\beta\alpha,\beta\beta}}J_\beta J_\beta\tilde{\rho}_\sigma(t)\mathcal{M}_{\alpha\alpha} =$$

$$J_\beta J_\beta \tilde{\rho}_\sigma(t)\mathcal{M}_{\alpha\alpha} + J_\beta J_\alpha \tilde{\rho}_\sigma(t)\mathcal{M}_{\alpha\beta} + J_\alpha J_\beta \tilde{\rho}_\sigma(t)\mathcal{M}_{\beta\alpha} + J_\alpha J_\alpha \tilde{\rho}_\sigma(t)\mathcal{M}_{\beta\beta}$$

$$\mathcal{M}_{\alpha\alpha} = \int_0^\infty du\, e^{-\frac{\kappa'u}{2}} Tr_c[A_\alpha(t)A_\alpha(t-u)\tilde{\rho}_c] \ \& \ \mathcal{M}^*_{\alpha\alpha} =$$

$$\int_0^\infty du\, e^{-\frac{\kappa'u}{2}} Tr_c[\tilde{\rho}_c A_\alpha(t-u)A_\alpha(t)]$$

$$\mathcal{N}_{\alpha\alpha} = \int_0^\infty du\, e^{-\frac{\kappa'u}{2}} Tr_c[A_\alpha(t)\tilde{\rho}_c A_\alpha(t-u)] \ \& \ \mathcal{N}^*_{\alpha\alpha} =$$

$$\int_0^\infty du\, e^{-\frac{\kappa'u}{2}} Tr_c[A_\alpha(t-u)\tilde{\rho}_c A_\alpha(t)]$$

and similar summation rules with the other terms. Using the cyclic property of the trace and the cavity correlation functions, all four terms can be collected:

$$\frac{d}{dt}\tilde{\rho}_\sigma(t) = -\gamma[2\hat{J}_-\tilde{\rho}_\sigma(t)\hat{J}_- - \hat{J}_-\hat{J}_-\tilde{\rho}_\sigma(t) - \tilde{\rho}_\sigma(t)\hat{J}_-\hat{J}_-]C^{++}(t) +$$

$$\gamma[2\hat{J}_+\tilde{\rho}_\sigma(t)\hat{J}_- - \hat{J}_-\hat{J}_+\tilde{\rho}_\sigma(t) - \tilde{\rho}_\sigma(t)\hat{J}_-\hat{J}_+]C^{+-}(t) +$$

$$\gamma[2\hat{J}_-\tilde{\rho}_\sigma(t)\hat{J}_+ - \hat{J}_+\hat{J}_-\tilde{\rho}_\sigma(t) - \tilde{\rho}_\sigma(t)\hat{J}_+\hat{J}_-]C^{-+}(t) +$$

$$\gamma[2\hat{J}_+\tilde{\rho}_\sigma(t)\hat{J}_+ - \hat{J}_+\hat{J}_+\tilde{\rho}_\sigma(t) - \tilde{\rho}_\sigma(t)\hat{J}_+\hat{J}_+]C^{--}(t)$$

where on resonance ($\Delta=0$) these correlation functions reduce to $$C^{++}(t) = \int_0^\infty du\, e^{-\frac{\kappa'u}{2}} Tr_c[A^+(t)A^+(t-u)\tilde{\rho}_c] =$$

$$e^{i2\Delta t}\int_0^\infty du\, e^{-\frac{(\kappa'+i\Delta)u}{2}} Tr_c[\hat{a}^+\hat{a}^+\tilde{\rho}_c] = \frac{2}{\kappa}Tr_c[\hat{a}^+\hat{a}^+\tilde{\rho}_c]$$

$$C^{+-}(t) = \int_0^\infty du\, e^{-\frac{\kappa'u}{2}} Tr_c[A^+(t)A(t-u)\tilde{\rho}_c] =$$

$$\int_0^\infty du\, e^{-\frac{(\kappa'-i\Delta)u}{2}} Tr_c[\hat{a}^+\hat{a}\tilde{\rho}_c] = \frac{2}{\kappa}Tr_c[\hat{a}^+\hat{a}\tilde{\rho}_c]$$

$$C^{-+}(t) = \int_0^\infty du\, e^{-\frac{\kappa'u}{2}} Tr_c[A(t)A^+(t-u)\tilde{\rho}_c] =$$

$$\int_0^\infty du\, e^{-\frac{(\kappa'+i\Delta)u}{2}} Tr_c[\hat{a}\hat{a}^+\tilde{\rho}_c] = \frac{2}{\kappa}Tr_c[\hat{a}\hat{a}^+\tilde{\rho}_c]$$

$$C^{--}(t) = \int_0^\infty du\, e^{-\frac{\kappa'u}{2}} Tr_c[A(t)\tilde{\rho}_c A(t-u)] =$$

$$e^{-i2\Delta t}\int_0^\infty du\, e^{-\frac{(\kappa'-i\Delta)u}{2}} Tr_c[\hat{a}\hat{a}\tilde{\rho}_c] = \frac{2}{\kappa}Tr_c[\hat{a}\hat{a}\tilde{\rho}_c]$$

Therefore, $$\frac{d}{dt}\tilde{\rho}_\sigma(t) = \frac{2\gamma}{\kappa'}[2\hat{J}_-\tilde{\rho}_\sigma(t)\hat{J}_- - \hat{J}_-\hat{J}_-\tilde{\rho}_\sigma(t) - \tilde{\rho}_\sigma(t)\hat{J}_-\hat{J}_-]Tr_c[\hat{a}^+\hat{a}^+\tilde{\rho}_c] +$$

$$\frac{2\gamma}{\kappa'}[2\hat{J}_+\tilde{\rho}_\sigma(t)\hat{J}_- - \hat{J}_-\hat{J}_+\tilde{\rho}_\sigma(t) - \tilde{\rho}_\sigma(t)\hat{J}_-\hat{J}_+]Tr_c[\hat{a}^+\hat{a}\tilde{\rho}_c] +$$

$$\frac{2\gamma}{\kappa'}[2\hat{J}_-\tilde{\rho}_\sigma(t)\hat{J}_+ - \hat{J}_+\hat{J}_-\tilde{\rho}_\sigma(t) - \tilde{\rho}_\sigma(t)\hat{J}_+\hat{J}_-]Tr_c[\hat{a}\hat{a}^+\tilde{\rho}_c] +$$

$$\frac{2\gamma}{\kappa'}[2\hat{J}_+\tilde{\rho}_\sigma(t)\hat{J}_+ - \hat{J}_+\hat{J}_+\tilde{\rho}_\sigma(t) - \tilde{\rho}_\sigma(t)\hat{J}_+\hat{J}_+]Tr_c[\hat{a}\hat{a}\tilde{\rho}_c]$$

Lastly, we calculate the cavity correlations. The cavity, such as squeezing cavity 12 in the exemplary system 3, is in a squeezed thermal equilibrium state. Therefore, the cavity correlations are calculated as follows:

$$\rho_c \to \tilde{\rho}_c^{Sq} = S(t)\rho_{TH}S^+(t) \to \langle\mu\tilde{\rho}_c^{Sq}\rangle \equiv Tr[S^+(t)\mu S(t)\rho_{TH}]$$
$$\& \ \mu = \{\hat{a}^{+^2}, \hat{a}^+\hat{a}, \hat{a}\hat{a}^+, \hat{a}\hat{a}\}.$$

With $$\begin{bmatrix}\hat{a} \\ \hat{a}^+\end{bmatrix} \xrightarrow{Sqz} \begin{bmatrix}S^+(t)\hat{a}S(t) \\ S^+(t)\hat{a}^+S(t)\end{bmatrix} = \begin{bmatrix}\hat{a}(t) \\ \hat{a}^+(t)\end{bmatrix} = \begin{bmatrix}\cosh[r(t)]\hat{a} + \sinh[r(t)]\hat{a}^+ \\ \cosh[r(t)]\hat{a}^+ + \sinh[r(t)]\hat{a}\end{bmatrix}$$

the correlations become:

$$Tr_c[\hat{a}^+\hat{a}^+\tilde{\rho}_c] \xrightarrow{SqzTH} Tr[S^+(t)\hat{a}^+\hat{a}^+S(t)\rho_{TH}]$$

$$S^+(t)\hat{a}^+\hat{a}^+S(t) = S^+(t)\hat{a}^+S(t)S^+(t)\hat{a}^+S(t) \equiv \hat{a}^+(t)\hat{a}^+(t) =$$

$$\cosh^2[r(t)]\hat{a}^{+^2} + (\cosh[r(t)]\sinh[r(t)])(\hat{a}^+\hat{a} + \hat{a}\hat{a}^+) + \sinh^2[r(t)]\hat{a}^2$$

and recognizing terms like $Tr[\hat{a}^{+^2}\rho_{TH}]=Tr[\hat{a}^2\rho_{TH}]=0$ & $[\hat{a},\hat{a}^+]=1$ we get $$Tr[\hat{a}^+(t)\hat{a}^+(t)\rho_{TH}] = (\cosh[r(t)]\sinh[r(t)])Tr[(\hat{a}^+\hat{a} + \hat{a}\hat{a}^+)\rho_{TH}] =$$

$$(\cosh[r(t)]\sinh[r(t)])Tr[(2\hat{a}^+\hat{a} + 1)\rho_{TH}] = (\cosh[r(t)]\sinh[r(t)])(2\bar{n} + 1)$$

The cavity average occupation is $\bar{n}=\langle\hat{n}\rangle=Tr(\hat{n}\rho_{TH})=Tr(\hat{a}^+\hat{a}\rho_{TH})$ and $$\bar{n} = \frac{1}{\left[\exp\left(\frac{\hbar\nu}{k_BT}\right)-1\right]}.$$

Following the same procedure, then the remaining cavity correlations are:

$$Tr_c[\hat{a}^+\hat{a}\tilde{\rho}_c] \xrightarrow{SqzTH} Tr[S^+(t)\hat{a}^+\hat{a}S(t)\rho_{TH}] =$$

$$Tr[\hat{a}^+(t)\hat{a}(t)\rho_{TH}] = \cosh^2[r(t)]Tr(\hat{a}^+\hat{a}\rho_{TH}) + \sinh^2[r(t)]Tr(\hat{a}\hat{a}^+\rho_{TH}) =$$

$$\cosh^2[r(t)]\bar{n} + \sinh^2[r(t)]Tr((\hat{a}^+\hat{a}+1)\rho_{TH}) = \cosh^2[r(t)]\bar{n} + \sinh^2[r(t)](\bar{n}+1)$$

$$Tr_c[\hat{a}\hat{a}^+\tilde{\rho}_c] \xrightarrow{SqzTH} Tr[S^+(t)\hat{a}\hat{a}^+S(t)\rho_{TH}] =$$

$$Tr[\hat{a}(t)\hat{a}^+(t)\rho_{TH}] = \cosh^2[r(t)]Tr(\hat{a}\hat{a}^+\rho_{TH}) + \sinh^2[r(t)]Tr(\hat{a}^+\hat{a}\rho_{TH}) =$$

$$\cosh^2[r(t)]Tr((\hat{a}^+\hat{a}+1)\rho_{TH}) + \sinh^2[r(t)]\bar{n} = \cosh^2[r(t)](\bar{n}+1) + \sinh^2[r(t)]\bar{n}$$

$$Tr_c[\hat{a}\hat{a}\tilde{\rho}_c] \xrightarrow{SqzTH} Tr[S^+(t)\hat{a}\hat{a}S(t)\rho_{TH}] =$$

$$Tr[\hat{a}(t)\hat{a}(t)\rho_{TH}] = (\cosh[r(t)]\sinh[r(t)])Tr[(\hat{a}\hat{a}^+ + \hat{a}^+\hat{a})\rho_{TH}] =$$

$$(\cosh[r(t)]\sinh[r(t)])Tr[(2\hat{a}^+\hat{a}+1)\rho_{TH}] = (\cosh[r(t)]\sinh[r(t)])(2\bar{n}+1)$$

To summarize:

$$Tr_c[\hat{a}^+\hat{a}^+\tilde{\rho}_c] \xrightarrow{SqzTH} (\cosh[r(t)]\sinh[r(t)])(2\bar{n}+1) =$$

$$(\cosh[r(t)]\sinh[r(t)])(\bar{n}+1) + (\cosh[r(t)]\sinh[r(t)])\bar{n}$$

$$Tr_c[\hat{a}^+\hat{a}\tilde{\rho}_c] \xrightarrow{SqzTH} \cosh^2[r(t)]\bar{n} + \sinh^2[r(t)](\bar{n}+1) =$$

$$\sinh^2[r(t)](\bar{n}+1) + \cosh^2[r(t)]\bar{n}$$

$$Tr_c[\hat{a}\hat{a}^+\tilde{\rho}_c] \xrightarrow{SqzTH} \cosh^2[r(t)](\bar{n}+1) + \sinh^2[r(t)]\bar{n}$$

$$Tr_c[\hat{a}\hat{a}\tilde{\rho}_c] \xrightarrow{SqzTH} (\cosh[r(t)]\sinh[r(t)])(2\bar{n}+1) =$$

$$(\cosh[r(t)]\sinh[r(t)])(\bar{n}+1) + (\cosh[r(t)]\sinh[r(t)])\bar{n}$$

Substituting these cavity correlation functions into the differential equation then yields an equation that can be written into the following Lindblad form (explicitly with, for example, the spin ensemble 10 only having eliminated the dependence on the squeezing cavity 12):

$$\frac{d}{dt}\tilde{\rho}_\sigma(t) = \sum_{l=1}^{2}[2R_l\tilde{\rho}_\sigma(t)R_l^+ - R_l^+R_l\tilde{\rho}_\sigma(t) - \tilde{\rho}_\sigma(t)R_l^+R_l]$$

where $$R_1 = \left(\sqrt{\frac{\gamma}{\kappa'}(\bar{n}+1)}\right)R \ \& \ R_2 = \left(\sqrt{\frac{\gamma}{\kappa'}\bar{n}}\right)R^+$$

and $$R = \cosh[r(t)]\hat{J}_- + \sinh[r(t)]\hat{J}_+.$$

The steady state solution results in an intelligent state $$\tilde{\rho}_\sigma(\infty) = e^{\beta\hat{J}_z}e^{-i\frac{\pi}{2}\hat{J}_y}|J, M=0\rangle\langle J, M=0|e^{i\frac{\pi}{2}\hat{J}_y}e^{-\beta\hat{J}_z}$$

whereby a nonunitary squeezing transformation is part of the final state demonstrating that the spin ensemble state has been transformed to a squeezed spin ensemble 10. Therefore, the cavity squeezed state, for example for the squeezed cavity 12 in system 3, has been dissipatively transferred to the strongly coupled spin ensemble.

However, the final steady-state, a squeezed spin ensemble, such as spin ensemble 10 in system 3, is described by the cavity squeezing characteristics therefore placing the ensemble in a thermal state with mean photon number given by $$\langle\bar{N}\rangle_{Sqz} = \sinh^2[r(t)](\bar{n}+1) + \cosh^2[r(t)]\bar{n}.$$

These squeezing characteristics imply a highly mixed state even beyond the equilibrium Boltzmann distribution.

A time-dependent analysis is useful to ascertain the temporal characteristics. To that end, we expand the master equation and collect terms as follows:

$$\frac{d}{dt}\tilde{\rho}_\sigma(t) = 2\frac{\gamma}{\kappa'}(\bar{n}+1)\cosh^2[r(t)]\left(\hat{J}_-\tilde{\rho}_\sigma\hat{J}_+ - \frac{1}{2}\{\hat{J}_+\hat{J}_-, \tilde{\rho}_\sigma\}\right) +$$

$$2\frac{\gamma}{\kappa'}\bar{n}\sinh^2[r(t)]\left(\hat{J}_-\tilde{\rho}_\sigma\hat{J}_+ - \frac{1}{2}\{\hat{J}_+\hat{J}_-, \tilde{\rho}_\sigma\}\right) +$$

$$2\frac{\gamma}{\kappa'}(\bar{n}+1)\sinh^2[r(t)]\left(\hat{J}_+\tilde{\rho}_\sigma\hat{J}_- - \frac{1}{2}\{\hat{J}_-\hat{J}_+, \tilde{\rho}_\sigma\}\right) +$$

$$2\frac{\gamma}{\kappa'}\bar{n}\cosh^2[r(t)]\left(\hat{J}_+\tilde{\rho}_\sigma\hat{J}_- - \frac{1}{2}\{\hat{J}_-\hat{J}_+, \tilde{\rho}_\sigma\}\right) + \left[2\frac{\gamma}{\kappa'}(\bar{n}+1) + 2\frac{\gamma}{\kappa'}\bar{n}\right]$$

$$\cosh[r(t)]\sinh[r(t)]\left(\hat{J}_+\tilde{\rho}_\sigma\hat{J}_+ + \hat{J}_-\tilde{\rho}_\sigma\hat{J}_- - \frac{1}{2}\{\hat{J}_+\hat{J}_+ + \hat{J}_-\hat{J}_-, \tilde{\rho}_\sigma\}\right),$$

Defining the constants $$N = \{\cosh^2[r(t)] + \sinh^2[r(t)]\}\bar{n} + \sinh^2[r(t)]$$

$$M = \cosh[r(t)]\sinh[r(t)](2\bar{n}+1)$$

we write $$\frac{d}{dt}\tilde{\rho}_\sigma(t) =$$

$$2\frac{\gamma}{\kappa'}(N+1)\left(\hat{J}_-\tilde{\rho}_\sigma\hat{J}_+ - \frac{1}{2}\{\hat{J}_+\hat{J}_-, \tilde{\rho}_\sigma\}\right) + 2\frac{\gamma}{\kappa'}N\left(\hat{J}_+\tilde{\rho}_\sigma\hat{J}_- - \frac{1}{2}\{\hat{J}_-\hat{J}_+, \tilde{\rho}_\sigma\}\right) +$$

$$2\frac{\gamma}{\kappa'}M\left(\hat{J}_+\tilde{\rho}_\sigma + \hat{J}_-\tilde{\rho}_\sigma\hat{J}_- - \frac{1}{2}\{\hat{J}_+\hat{J}_+ + \hat{J}_-\hat{J}_-, \tilde{\rho}_\sigma\}\right)$$

Now it is possible to obtain the diagonal population dynamics. Inspection of the above equation reveals that only the first two terms (e.g., the ones multiplying N+1 and N) involve populations while the last term (e.g., the one multiplying M) represents the coherences.

Their temporal evolution can be treated independently. Letting $P_m(t) = \langle m|\tilde{\rho}_\sigma(t)|m\rangle$ for each subspace J of the state |J, m⟩ (using the shorthand |J, m⟩→|m⟩) we get $$\frac{d}{dt}P_m(t) = 2\frac{\gamma}{\kappa'}(N+1)\left(\langle m|\hat{J}_-\tilde{\rho}_\sigma(t)\hat{J}_+|m\rangle - \frac{1}{2}\langle m|\{\hat{J}_+\hat{J}_-, \tilde{\rho}_\sigma(t)\}|m\rangle\right) +$$

$$2\frac{\gamma}{\kappa'}N\left(\langle m|\hat{J}_+\tilde{\rho}_\sigma(t)J'_-|m\rangle - \frac{1}{2}\langle m|\{\hat{J}_-\hat{J}_+, \tilde{\rho}_\sigma(t)\}|m\rangle\right).$$

The terms are calculated as follows:

$$\langle m|\hat{J}_\mp\tilde{\rho}_\sigma(t)\hat{J}_\pm|m\rangle = [J(J+1) - m(m\pm1)]$$

$$\langle m\pm1|\tilde{\rho}_\sigma(t)|m\pm1\rangle = [J(J+1) - m(m\pm1)]P_{m\pm1}(t)$$

and $$\langle m|\hat{J}_\pm \hat{J}_\mp, \hat{p}_\sigma(t)|m\rangle =$$

$$\langle m|[\hat{J}_\pm \hat{J}_\mp \hat{p}_\sigma(t) + \hat{p}_\sigma(t)\hat{J}_\pm \hat{J}_\mp]|m\rangle = \langle m|\hat{J}_\pm \hat{J}_\mp \hat{p}_\sigma(t)|m\rangle + \langle m|\hat{p}_\sigma(t)\hat{J}_\pm \hat{J}_\mp|m\rangle =$$

$$\sqrt{J(J+1) - m(m \mp 1)} \left[\langle m \pm 1|\hat{J}_\mp \hat{p}_\sigma(t)|m\rangle + \langle m|\hat{p}_\sigma(t)\hat{J}_\pm|m \mp 1\rangle\right] =$$

$$2[J(J+1) - m(m \mp 1)]\langle m|\hat{p}_\sigma(t)|m\rangle = 2[J(J+1) - m(m \mp 1)]P_m(t)$$

Therefore $$\frac{d}{dt}P_m(t) = -2\frac{\gamma}{\kappa'}[N M_m^+ + (N+1)M_m^-]P_m(t) +$$

$$2\frac{\gamma}{\kappa'}[N M_{m-1}^+ P_{m-1}(t) + (N+1)M_{m+1}^- P_{m+1}(t)]$$

where $$M_m^\pm = [J(J+1) - m(m \pm 1)]$$

The result is a hierarchy of coupled rate equations. As stated above, the steady-state yields a distribution based on the characteristics of N and can be solved from the resulting two-term recursion relation. The temporal decay or buildup is governed by the constant $$2\frac{\gamma}{\kappa'}$$

where $\gamma = g e^{r(t)}$ as defined above. If the squeezing is not used, then the temporal evolution is characterized by g only and the population statistics is governed by $\bar{n}$.

Squeezing Cavity Mediated Cavity Cooling

As shown for example in FIG. 7 for system 3, the dissipative squeezing strongly couples the spin ensemble 10 to the squeezing cavity 12. This strong or exponentially enhanced g-coupling or resonator-spin coupling leads to faster radiative processes compared to thermal processes.

The squeezing, for example performed by squeezing cavity 12 in system 3, while strongly coupling the spin ensemble 10, heats up the squeezing cavity 12 and consequently the spins in the spin ensemble 10. To cool them, coupling can be applied to another cavity, for example the broadband squeezing cavity 13, maintained at a cold temperature. The Hamiltonian for such a configuration can be written as follows:

$$H = H_0 + H_{int} + H_{damp}$$

$$H_0 = \omega_a \hat{a}^+ \hat{a} + \omega_b \hat{b}^+ \hat{b} + \omega_s \hat{J}_z + H_E$$

$$H_{int} = g_a(\hat{a}^+ \hat{J}_- + \hat{a}\hat{J}_+) + g_b(\hat{b}^+ \hat{J}_- + \hat{b}\hat{J}_+) + \Gamma(\hat{a}^+ \hat{b} + \hat{a}\hat{b}^+)$$

$$H_E = \sum_{k=1}^M g_k^c \hat{c}_k^+ \hat{c}_k + \sum_{k=1}^M g_k^d \hat{d}_k^+ \hat{d}_k \ \& \ H_{damp} =$$

$$\sum_{k=1}^M g_k^c(\hat{c}_k^+ \hat{a} + \hat{c}_k \hat{a}^+) + \sum_{k=1}^M g_k^d(\hat{d}_k^+ \hat{b} + \hat{d}_k \hat{b}^+)$$

where, as before, a standard bosonic environment (e.g., such as the cryogen 14) is assumed and represented by the set of modes $\{\hat{c}_k^+, \hat{c}_k\}$ for cavity $\hat{a}$ and $\{\hat{d}_k^+, \hat{d}_k\}$ for cavity $\hat{b}$.

Let's designate the $\hat{a}$ cavity as the squeezing cavity 12 and the $\hat{b}$ cavity as the cold cavity 15 that couples the spins in the spin ensemble 10 to the cold load or cryogen 14. However, since the coupling $g_b$ is known to be weak, on the order of micro-Hertz and is unaffected by the squeezing, we can neglect its direct effect and focus on the indirect coupling through the electromagnetic coupling between the two cavities 12 and 15 encapsulated in their interaction $\Gamma(\hat{a}^+\hat{b}+\hat{a}\hat{b}^+)$. As before, the squeezing on cavity $\hat{a}$ enhances the couplings to it and we get the following:

$$H_0^{sqz} = \omega_a^{sqz} \hat{a}^+ \hat{a} + \omega_b \hat{b}^+ \hat{b} + \omega_s \hat{J}_z + H_E$$

$$H_{int}^{sqz} =$$

$$g_a e^{r(t)}(\hat{a}^+ \hat{J}_- + \hat{a}\hat{J}_+) + \Gamma e^{r(t)}(\hat{a}^+ \hat{b} + \hat{a}\hat{b}^+) = \gamma_a(\hat{a}^+ \hat{J}_- + \hat{a}\hat{J}_+) + \Gamma'(\hat{a}^+ \hat{b} + \hat{a}\hat{b}^+)$$

with $\gamma_a = g_a e^{r(t)}$ & $\Gamma' = \Gamma e^{r(t)}$ $$H_{damp}^{sqz} = \sum_{k=1}^M \gamma_k^c(\hat{c}_k^+ \hat{a} + \hat{c}_k \hat{a}^+) + \sum_{k=1}^M g_k^d(\hat{d}_k^+ \hat{b} + \hat{d}_k \hat{b}^+)$$

with $\gamma_k^c = g_k^c e^{r(t)}$

Further, let's consider the dispersive regime $\omega_a^{sqz} \ll \omega_b$ and $$\varepsilon = \frac{\Gamma'}{\Delta} \ll 1$$

where $\Delta = \omega_b - \omega_a^{sqz}$. In this regime, the two cavities are approximately diagonal, and we can transform the full H by $U_d = \exp[-\varepsilon(\hat{a}^+\hat{b} - \hat{a}\hat{b}^+)]$ to obtain an effective Hamiltonian. The operator $U_d$ implements a Schrieffer-Wolff transform. The calculations will use the Baker-Campbell-Hausdorf (BCH) formula $$e^{\hat{A}} \hat{B} e^{-\hat{A}} = \hat{B} + [\hat{A}, \hat{B}] + \frac{1}{2!}[\hat{A}, [\hat{A}, \hat{B}]] + \ldots$$

for any two non-commutative Hermitian operators $\hat{A}$ & $\hat{B}$ (i.e. $[\hat{A}, \hat{B}] \neq 0$).

First, transforming the cavity coupling term:

$$\Gamma'(\hat{a}^+\hat{b} + \hat{a}\hat{b}^+) \rightarrow \Gamma' U_d(\hat{a}^+\hat{b} + \hat{a}\hat{b}^+)U_d^{-1} = \Gamma'\{(\hat{a}^+\hat{b} + \hat{a}\hat{b}^+) - \varepsilon[(\hat{a}^+\hat{b} - \hat{a}\hat{b}^+), (\hat{a}^+\hat{b} + \hat{a}\hat{b}^+)] + \sigma(\varepsilon^2)\}$$

$$= \Gamma'(\hat{a}^+\hat{b} + \hat{a}\hat{b}^+) - \varepsilon\Gamma'([\hat{a}^+\hat{b}, \hat{a}\hat{b}^+] - [\hat{a}\hat{b}^+, \hat{a}^+\hat{b}])$$

$$= \Gamma'(\hat{a}^+\hat{b} + \hat{a}\hat{b}^+) - \varepsilon\Gamma'(\hat{a}^+\hat{a}[\hat{b}, \hat{b}^+] - [\hat{a}, \hat{a}^+]\hat{b}^+\hat{b})$$

$$= \Gamma'(\hat{a}^+\hat{b} + \hat{a}\hat{b}^+) - \varepsilon\Gamma'(\hat{a}^+\hat{a} - \hat{b}^+\hat{b})$$

Next, transforming the cavity-free Hamiltonians:

$$(\omega_a^{sqz}\hat{a}^+\hat{a} + \omega_b\hat{b}^+\hat{b}) \to U_d(\omega_a^{sqz}\hat{a}^+\hat{a} + \omega_b\hat{b}^+\hat{b})U_d^{-1} = \omega_a^{sqz}U_d\hat{a}^+\hat{a}U_d^{-1} + \omega_b U_d\hat{b}^+\hat{b}U_d^{-1}$$

$$= \omega_a^{sqz}\hat{a}^+\hat{a} + \omega_b\hat{b}^+\hat{b} - \varepsilon\big[(\hat{a}^+\hat{b} - \hat{a}\hat{b}^+), (\omega_a^{sqz}\hat{a}^+\hat{a} + \omega_b\hat{b}^+\hat{b})\big] + o(\varepsilon^2)$$

$$= \omega_a^{sqz}\hat{a}^+\hat{a} + \omega_b\hat{b}^+\hat{b} -$$

$$= \varepsilon\{\omega_a^{sqz}([\hat{a}^+\hat{b},\hat{a}^+\hat{a}] - [\hat{a}\hat{b}^+,\hat{a}^+\hat{a}]) + \omega_b([\hat{a}^+\hat{b},\hat{b}^+\hat{b}] - [\hat{a}\hat{b}^+,\hat{b}^+\hat{b}])\}$$

$$= \omega_a^{sqz}\hat{a}^+\hat{a} + \omega_b\hat{b}^+\hat{b} - \varepsilon\{-\omega_a^{sqz}(\hat{a}^+\hat{b} + \hat{a}\hat{b}^+) + \omega_b(\hat{a}^+\hat{b} + \hat{a}\hat{b}^+)\}$$

$$= \omega_b^{sqz}\hat{a}^+\hat{a} + \omega_b\hat{b}^+\hat{b} - \varepsilon[(\omega_b - \omega_a^{sqz})(\hat{a}^+\hat{b} + \hat{a}\hat{b}^+)]$$

$$= \omega_b^{sqz}\hat{a}^+\hat{a} + \omega_b\hat{b}^+\hat{b} - \Gamma'(\hat{a}^+\hat{b} + \hat{a}\hat{b}^+)$$

$$= \omega_b^{sqz}\hat{a}^+\hat{a} + \omega_b\hat{b}^+\hat{b} - \varepsilon\Delta(\hat{a}^+\hat{b} + \hat{a}\hat{b}^+)$$

The cavity-only terms are now the sum of the transformed free and coupled Hamiltonians:

$$H_{eff}^{cav} = \omega_a^{sqz}\hat{a}^+\hat{a} + \omega_b\hat{b}^+\hat{b} - \frac{\Gamma'^2}{\Delta}(\hat{a}^+\hat{a} - \hat{b}^+\hat{b}) = \Omega_a\hat{a}^+\hat{a} + \Omega_b\hat{b}^+\hat{b}$$

with $$\Omega_a = \omega_a^{sqz} - \frac{\Gamma'^2}{\Delta} \quad \& \quad \Omega_b = \omega_b + \frac{\Gamma'^2}{\Delta}$$

Therefore, the cavities $\hat{a}$ and $\hat{b}$ are now in a diagonal frame accompanied by shifts in their energy states. The squeezing cavity $\hat{a}$ (e.g., squeezing cavity 12 in system 1 of FIG. 4) is coupled to the spins and transforming this coupling creates the indirect coupling to the cavity $\hat{b}$ (e.g., cold cavity 15 in system 1 of FIG. 4), the sought-after result:

$$\gamma_a(\hat{a}^+\hat{J}_- + \hat{a}\hat{J}_+) \to \gamma_a U_d(\hat{a}^+\hat{J}_- + \hat{a}\hat{J}_+)U_d^{-1} = \gamma_a(\hat{a}^+\hat{J}_- + \hat{a}\hat{J}_+) - \varepsilon\gamma_a\big[(\hat{a}^+\hat{b} - \hat{a}\hat{b}^+), (\hat{a}^+\hat{J}_- + \hat{a}\hat{J}_+)\big] + o(\varepsilon^2)$$

$$= \gamma_a(\hat{a}^+\hat{J}_- + \hat{a}\hat{J}_+) - \varepsilon\gamma_a([\hat{a}^+\hat{b},\hat{a}\hat{J}_+] - [\hat{a}\hat{b}^+,\hat{a}^+\hat{J}_-])$$

$$= \gamma_a(\hat{a}^+\hat{J}_- + \hat{a}\hat{J}_+) + \varepsilon\gamma_a(\hat{b}^+\hat{J}_- + \hat{b}\hat{J}_+)$$

Finally, the effect of $U_d$ on the squeeze enhanced channel of $H_{damp}^{sqz}$ can be calculated:

$$\sum_{k=1}^{M}\gamma_k^c(\hat{c}_k^+\hat{a} + \hat{c}_k\hat{a}^+) \to \sum_{k=1}^{M}\gamma_k^c U_d(\hat{c}_k^+\hat{a} + c_k\hat{a}^+)U_d^{-1} =$$

$$\sum_{k=1}^{M}\gamma_k^c(\hat{c}_k^+\hat{a} + \hat{c}_k\hat{a}^+) - \varepsilon\sum_{k=1}^{M}\gamma_k^c\big[(\hat{a}^+\hat{b} - \hat{a}\hat{b}^+), (\hat{c}_k^+\hat{a} + \hat{c}_k\hat{a}^+)\big] + o(\varepsilon^2) =$$

$$\sum_{k=1}^{M}\gamma_k^c(\hat{c}_k^+\hat{a} + \hat{c}_k\hat{a}^+) - \varepsilon\sum_{k=1}^{M}\gamma_k^c([\hat{a}^+\hat{b},\hat{c}_k^+\hat{a}] - [\hat{a}\hat{b}^+,\hat{c}_k\hat{a}^+]) =$$

$$\sum_{k=1}^{M}\gamma_k^c(\hat{c}_k^+\hat{a} + \hat{c}_k\hat{a}^+) + \varepsilon\sum_{k=1}^{M}\gamma_k^c(\hat{c}_k^+\hat{b} + \hat{c}_k\hat{b}^+)$$

This shows that the squeezed coupling between the $\hat{a}$ and $\hat{b}$ cavities induces a strong squeezed noise source in the cooling cavity $\hat{b}$ detrimental to the cooling channel $\hat{b}$.

Induced Squeezed Noise Suppression

The induced squeezed noise, for example by squeezing cavity 12 in FIG. 4, is very strong and requires eliminating completely. To do so, a squeezing technique is used that should only eliminate the noise, without affecting the enhanced coupling induced by the squeezing cavity $\hat{a}$ (e.g., squeezing cavity 12 in system 1 of FIG. 4). Therefore, a squeezed reservoir, such as broadband squeezing cavity 13 in system 1, is designed that has the same (or substantially the same) amplitude as the squeezing cavity $\hat{a}$, but only cancels the induced squeezed noise.

This is achieved by applying a broadband squeezed reservoir $\hat{c}_k$ (e.g., broadband squeezing cavity 13 in system 1 of FIG. 4) on cavity $\hat{a}$. To maintain the same amplitude as cavity $\hat{a}$, yet be broadband, multiple resonant cavities $\hat{c}_k$ can be used so their resonant frequencies are slightly different but overlap and create the effect of a broadband resonator centered on the frequency of cavity $\hat{a}$ or implement impedance-engineered broadening using a feedline impedance transformer.

Such a squeezed reservoir in effect transforms $\hat{a}$ as follows:

$$\hat{a} \to \hat{a}_s = \cosh[r_\varphi(t)]\hat{a} + e^{i\varphi}\sinh[r_\varphi(t)]\hat{a}^+$$

The phase is relevant and crucial in keeping track of the quadrature that is being squeezed. Putting the phase reference back in the original squeezing, the overall transformation becomes $$\begin{bmatrix}\hat{a}_S \\ \hat{a}_S^+\end{bmatrix} = \begin{bmatrix}\hat{a}(t) \\ \hat{a}^+(t)\end{bmatrix} \xrightarrow{Sqz\ BB\ Res} \begin{bmatrix}\cosh[r_\theta(t)]\{\cosh[r_\varphi(t)]\hat{a} + e^{i\varphi}\sinh[r_\varphi(t)]\hat{a}^+\} + \\ e^{i\theta}\sinh[r_\theta(t)]\{\cosh[r_\varphi(t)]\hat{a}^+ + e^{-i\varphi}\sinh[r_\varphi(t)]\hat{a}\} \\ \cosh[r_\theta(t)]\{\cosh[r_\varphi(t)]\hat{a}^+ + e^{-i\varphi}\sinh[r_\varphi(t)]\hat{a}\} + \\ e^{-i\theta}\sinh[r_\theta(t)]\{\cosh[r_\varphi(t)]\hat{a} + e^{i\varphi}\sinh[r_\varphi(t)]\hat{a}^+\}\end{bmatrix}$$

Collecting terms, we get $$\hat{a}_S = \{\cosh[r_\theta(t)]\cosh[r_\varphi(t)] + e^{i(\theta-\varphi)}\sinh[r_\theta(t)]\sinh[r_\varphi(t)]\}\hat{a} +$$

$$\{e^{i\varphi}\cosh[r_\theta(t)]\sinh[r_\varphi(t)] + e^{i\theta}\sinh[r_\theta(t)]\cosh[r_\varphi(t)]\}\hat{a}^+$$

$$\hat{a}_S^+ = \{\cosh[r_\theta(t)]\cosh[r_\varphi(t)] + e^{-i(\theta-\varphi)}\sinh[r_\theta(t)]\sinh[r_\varphi(t)]\}\hat{a}^+ +$$

-continued $$\begin{bmatrix} \hat{a}_S \\ \hat{a}_S^+ \end{bmatrix} = \begin{bmatrix} (X+\eta)\hat{a} + (\lambda+\mu)\hat{a}^+ \\ (X+\eta^*)\hat{a}^+ + (\lambda^*+\mu^*)\hat{a} \end{bmatrix}$$

$\{e^{-i\varphi}\cosh[r_\theta(t)]\sinh[r_\varphi(t)] + e^{-i\theta}\sinh[r_\theta(t)]\cosh[r_\varphi(t)]\}\hat{a}$ with the constants as defined below $X = \cosh[r_\theta(t)]\cosh[r_\varphi(t)]$ $\eta = e^{i(\theta-\varphi)}\sinh[r_\theta(t)]\sinh[r_\varphi(t)]$ $\lambda = e^{i\varphi}\cosh[r_\theta(t)]\sinh[r_\varphi(t)]$ $\mu = e^{i\theta}\sinh[r_\theta(t)]\cosh[r_\theta(t)]$ The corresponding reservoir correlations are therefore modified to $Tr[\hat{a}^+(t)\hat{a}^+(t)\rho_{TH}] \xrightarrow{Sqz\ BB\ Res} Tr[\hat{a}_S^+\hat{a}_S^+\rho_{TH}] =$
$(X+\eta^*)(\lambda^*+\mu^*)Tr[(\hat{a}^+\hat{a}+\hat{a}\hat{a}^+)\rho_{TH}] = (X+\eta^*)(\lambda^*+\mu^*)(2\bar{n}+1)$ $Tr[\hat{a}^+(t)\hat{a}(t)\rho_{TH}] \xrightarrow{Sqz\ BB\ Res} Tr[\hat{a}_S^+\hat{a}_S\rho_{TH}] =$
$(X+\eta^*)(X+\eta)Tr[\hat{a}^+\hat{a}\rho_{TH}] + (\lambda^*+\mu^*)(\lambda+\mu)Tr[\hat{a}\hat{a}^+\rho_{TH}] =$
$(X+\eta^*)(X+\eta)\bar{n} + (\lambda^*+\mu^*)(\lambda+\mu)(\bar{n}+1)$ $Tr[\hat{a}(t)\hat{a}^+(t)\rho_{TH}] \xrightarrow{Sqz\ BB\ Res} Tr[\hat{a}_S\hat{a}_S^+\rho_{TH}] =$
$(X+\eta)(X+\eta^*)Tr[\hat{a}\hat{a}^+\rho_{TH}] + (\lambda+\mu)(\lambda^*+\mu^*)Tr[\hat{a}^+\hat{a}\rho_{TH}] =$
$(X+\eta)(X+\eta^*)(\bar{n}+1) + (\lambda+\mu)(\lambda^*+\mu^*)\bar{n}$ $Tr[\hat{a}(t)\hat{a}(t)\rho_{TH}] \xrightarrow{Sqz\ BB\ Res} Tr[\hat{a}_S\hat{a}_S^+\rho_{TH}] =$
$(X+\eta)(\lambda+\mu)Tr[(\hat{a}\hat{a}^+ + \hat{a}^+\hat{a})\rho_{TH}] = (X+\eta)(\lambda+\mu)(2\bar{n}+1)$ Focusing on the combined squeezing channels implies that this dissipator can be represented by the transformed squeezing characteristics as $$\begin{bmatrix} N \\ M \end{bmatrix} = \begin{bmatrix} \{\cosh^2[r(t)] + \sinh^2[r(t)]\}\bar{n} + \sinh^2[r(t)] \\ \cosh[r(t)]\sinh[r(t)](2\bar{n}+1) \end{bmatrix} \xrightarrow{Sqz\ BB\ Res} \begin{bmatrix} N^{1,2} \\ M_S \end{bmatrix}$$

$N_S^1 = (X+\eta^*)(X+\eta)\bar{n} + (\lambda^*+\mu^*)(\lambda+\mu)(\bar{n}+1) =$
$(X^2 + X\eta + \eta^*X + \eta^*\eta)\bar{n} + (\lambda^*\lambda + \lambda^*\mu + \mu^*\lambda + \mu^*\mu)(\bar{n}+1) =$
$\cosh[2r_\theta(t)]\cosh[2r_\varphi(t)]\bar{n} + \frac{1}{2}\cos(\theta-\varphi)\sinh[2r_\theta(t)]\sinh[2r_\varphi(t)](2\bar{n}+1) +$
$\cosh^2[r_\theta(t)]\sinh^2[r_\varphi(t)] + \sinh^2[r_\theta(t)]\cosh^2[r_\varphi(t)]$ $N_S^2 = (X+\eta)(X+\eta^*)(\bar{n}+1) + (\lambda+\mu)(\lambda^*+\mu^*)\bar{n} =$
$(X^2 + X\eta^* + \eta X + \eta\eta^*)(\bar{n}+1) + (\lambda\lambda^* + \lambda\mu^* + \mu\lambda^* + \mu\mu^*)\bar{n} =$
$\cosh[2r_\theta(t)]\cosh[2r_\varphi(t)]\bar{n} + \frac{1}{2}\cos(\theta-\varphi)\sinh[2r_\theta(t)]\sinh[2r_\varphi(t)](2\bar{n}+1) +$
$\cosh^2[r_\theta(t)]\cosh^2[r_\varphi(t)] + \sinh^2[r_\theta(t)]\sinh^2[r_\varphi(t)]$ $M_S = (X+\eta^*)(\lambda^*+\mu^*)(2\bar{n}+1) =$
$e^{-i\varphi}\{\cosh[r_\theta(t)]\cosh[r_\varphi(t)] + e^{-i(\theta-\varphi)}\sinh[r_\theta(t)]\sinh[r_\theta(t)]\}$
$\{\cosh[r_\theta(t)]\sinh[r_\varphi(t)] + e^{-i(\theta-\varphi)}\sinh[r_\theta(t)]\cosh[r_\varphi(t)]\}(2\bar{n}+1)$ To nullify the noise, we phase match by letting:
$r_\theta(t) = r_\varphi(t) = r$ $\theta - \varphi = \Phi$ which implies $N_S^1 = \cosh^2(2r)\bar{n} + \frac{1}{2}\cos\Phi\sinh^2(2r)(2\bar{n}+1) + 2\cosh^2r\sin$ $h^2r = [\sinh^2(2r)+1]\bar{n} + \frac{1}{2}\cos\Phi\sinh^2(2r)(2\bar{n}+1) + \frac{1}{2}\sinh^2(2r) =$ $\frac{1}{2}[\sinh^2(2r)+1](2\bar{n}) + \frac{1}{2}\sinh^2(2r) + \frac{1}{2}\cos\Phi\sinh^2(2r)(2\bar{n}+1) =$ $\frac{1}{2}(1+\cos\Phi)\sinh^2(2r)(2\bar{n}+1) + \bar{n}$ $N_S^2 = \cosh^2(2r)\bar{n} + \frac{1}{2}\cos\Phi\sinh^2(2r)(2\bar{n}+1) + (\cosh^2r)^2 +$ $(\sinh^2 r)^2 = [\sinh^2(2r)+1]\bar{n} + \frac{1}{2}\cos\Phi\sinh^2(2r)(2\bar{n}+1) + (\cosh^2r)^2 +$ $(\sinh^2 r)^2 = [\sinh^2(2r)+1]\bar{n} + \frac{1}{2}\cos\Phi\sinh^2(2r)(2\bar{n}+1) + \frac{1}{2}\sinh^2(2r) + 1 =$ $\frac{1}{2}[\sinh^2(2r)+1](2\bar{n}) + \frac{1}{2}\sinh^2(2r) + \frac{1}{2}\cos\Phi\sinh^2(2r)(2\bar{n}+1) + 1 =$ $\frac{1}{2}(1+\cos\Phi)\sinh^2(2r)(2\bar{n}+1) + (\bar{n}+1)$ In this state, $N_S^1 = N_S^2 = M_S = 0$ when $\Phi = n\pi; n = \{\pm 1, \pm 3, \pm 5, \dots\}$.

Therefore, with the noise nullified, the full effective Hamiltonian is then $H^{sqz} = H_0^{sqz} + H_{int}^{sqz} + H_{damp} \xrightarrow{U_d}$ $H_{eff}^{cav} + \omega_s \hat{J}_z + \gamma_a(\hat{a}^+\hat{J}_- + \hat{a}\hat{J}_+) + \varepsilon\gamma_a(\hat{b}^+\hat{J}_- + \hat{b}\hat{J}_+) + H_{damp}^{eff}$ In this state, $N_S^1 = N_S^2 = M_S = 0$ when $\Phi = n\pi; n = \{\pm 1, \pm 3, \pm 5, \dots\}$.

Therefore, with the noise nullified, the full effective Hamiltonian is then $H^{sqz} = H_0^{sqz} + H_{int}^{sqz} + H_{damp} \xrightarrow{U_d}$ $H_{eff}^{cav} + \omega_s \hat{J}_z + \gamma_a(\hat{a}^+\hat{J}_- + \hat{a}\hat{J}_+) + \varepsilon\gamma_a(\hat{b}^+\hat{J}_- + \hat{b}\hat{J}_+) + H_{damp}^{eff}$ and keep only the effect of cavity $\hat{b}$ on the damping of the spins $H_{damp}^{eff} = \sum_{k=1}^{M} g_k^d (\hat{a}_k^+ \hat{b} + \hat{a}_k \hat{b}^+)$ Moving into the free Hamiltonian co-frames further transforms $H_{eff}$:

$H_{eff}^{sqz} \xrightarrow{H_{eff}^{cav} + H_E + \omega_s J_z} H_{eff}^{sqz'} = \gamma_a(\hat{a}^+\hat{J}_- e^{i\upsilon_a t} + \hat{a}\hat{J}_+ e^{-i\upsilon_a t}) +$ $\varepsilon\gamma_a(\hat{b}^+\hat{J}_- e^{i\upsilon_b t} + \hat{b}\hat{J}_+ e^{-i\upsilon_b t}) + \sum_{k=1}^{M} g_k^d(\hat{a}_k^+\hat{b}e^{i\upsilon_k t} + \hat{a}_k\hat{b}^+ e^{-i\upsilon_k t})$ where $\upsilon_a = \omega_s - \Omega_a;\ \upsilon_b = \omega_s - \Omega_b\ \&\ \upsilon_k = \omega_s - g_k^d$ As before, the damping channel can be represented by the Linbladian $\mathcal{D}[\hat{b}]\rho = \kappa_a[2\hat{b}\rho\hat{b}^+ - \{\hat{b}^+\hat{b}, \rho\}]$ with $\kappa_a \propto g_k^d$ The frequencies are adjusted so $\upsilon_b=0$ and $\upsilon_a \gg 1$. This ensures that the spins are dispersively and most importantly, non-resonantly coupled to the squeezing cavity $\hat{a}$ (e.g., squeezing cavity 12 in system 1 of FIG. 4), while they are resonantly coupled to the auxiliary cavity $\hat{b}$ (e.g., cold cavity 15 in system 1) to generate the necessary strong coupling to it.

In this manner, conditions are created that strongly couple the spins through the squeezing cavity $\hat{a}$ to the cold cavity $\vec{b}$ for the most efficient cooling. It is further assumed that the dominant loss channel is the b cavity that is connected to a cold load.

Under these conditions and the RWA approximation, we have the finally sought-after interaction for performing cavity cooling:

$$H'_{eff} \approx \varepsilon \gamma (\hat{b} \hat{J}_- + \hat{b} \hat{J}_+) + \mathcal{D}[\hat{b}]$$

Solving the ensuing master equation by following the same procedure as the previous section results in $$\frac{d}{dt} \rho'_{eff}(t) = 2\frac{\varepsilon\gamma}{\kappa_b}(\bar{n}+1)\left(\hat{J}_-\rho'_{eff}\hat{J}_+ - \frac{1}{2}\{\hat{J}_+\hat{J}_-, \rho'_{eff}\}\right) + 2\frac{\varepsilon\gamma}{\kappa_b}\bar{n}\left(\hat{J}_+\rho'_{eff}\hat{J}_- - \frac{1}{2}\{\hat{J}_-\hat{J}_+, \rho'_{eff}\}\right)$$

The population dynamics once again is obtained from $P_m(t) = \langle m|\rho'_{eff}(t)|m\rangle$ for each subspace J of the state $|J, m\rangle$. With the shorthand $|J, m\rangle \to |m\rangle$, we get the dynamic balancing expression $$\frac{d}{dt} P_m(t) = 2\frac{\varepsilon\gamma}{\kappa_b}(\bar{n}+1)\left(\langle m|\hat{J}_-\rho'_{eff}(t)\hat{J}_+|m\rangle - \frac{1}{2}\langle m|\{\hat{J}_+\hat{J}_-, \rho'_{eff}(t)\}|m\rangle\right) + 2\frac{\varepsilon\gamma}{\kappa_b}\bar{n}\left(\langle m|\hat{J}_+\rho'_{eff}(t)\hat{J}_-|m\rangle - \frac{1}{2}\langle m|\{\hat{J}_-\hat{J}_+, \rho'_{eff}(t)\}|m\rangle\right)$$

As before, it reduces to $$\frac{d}{dt}P_m(t) = -2\frac{\varepsilon\gamma}{\kappa_b}[\bar{n}M_m^+ + (\bar{n}+1)M_m^-]P_m(t) + 2\frac{\varepsilon\gamma}{\kappa_b}[\bar{n}M_{m-1}^+ P_{m-1}(t) + (\bar{n}+1)M_{m+1}^- P_{m+1}(t)]$$

where $$M_m^{\pm} = [J(J+1) - m(m \pm 1)]$$

The steady state solution gives $$[\bar{n}M_m^+ + (\bar{n}+1)M_m^-]P_m(\infty) = [\bar{n}M_{m-1}^+ P_{m-1}(\infty) + (\bar{n}+1)M_{m+1}^- P_{m+1}(\infty)]$$

which is a detailed balance equation with equal transition rates $M_m^{\pm}$.

Therefore, the equal upward and downward transitions can be written:

$$\bar{n}M_m^+ P_m(\infty) = (\bar{n}+1)M_{m+1}^- P_{m+1}(\infty) \to \bar{n}P_m(\infty) = (\bar{n}+1)P_{m+1}(\infty)$$

$$(\bar{n}+1)M_m^- P_m(\infty) = \bar{n}M_{m-1}^+ P_{m-1}(\infty) \to (\bar{n}+1)P_m(\infty) = \bar{n}P_{m-1}(\infty)$$

Using the first of these and starting with the state, $m=-J$ since $m=\{-J, -J+1, \ldots, +J\}$, we can recursively and using induction establish $$\bar{n}P_{-J}(\infty) = (\bar{n}+1)P_{-J+1}(\infty) \to P_{-J+1}(\infty) = \left(\frac{\bar{n}}{\bar{n}+1}\right)P_{-J}(\infty)$$

$$P_{-J+2}(\infty) = \left(\frac{\bar{n}}{\bar{n}+1}\right)P_{-J+1}(\infty) = \left(\frac{\bar{n}}{\bar{n}+1}\right)^2 P_{-J}(\infty)$$

$$\vdots$$

$$P_m(\infty) = \left(\frac{\bar{n}}{\bar{n}+1}\right)^{J+m} P_{-J}(\infty)$$

To solve for $P_{-J}(\infty)$, we use the normalization condition:

$$1 + \sum_{m=-J}^{m=+J} P_m(\infty) = P_{-J}(\infty) \sum_{m=-J}^{m=+J} \left(\frac{\bar{n}}{\bar{n}+1}\right)^{J+m} = P_{-J}(\infty) \sum_{s=0}^{s=+2J} \left(\frac{\bar{n}}{\bar{n}+1}\right)^s$$

The sum on the right-hand side is a finite geometric series with $$r = \frac{\bar{n}}{\bar{n}+1}$$

and is summed as $$\sum_{s=0}^{s=+2J} r^s = \frac{1-e^{2J+1}}{1-r} \to \frac{1-\left(\frac{\bar{n}}{\bar{n}+1}\right)^{2J+1}}{1-\left(\frac{\bar{n}}{\bar{n}+1}\right)} = \frac{\frac{(\bar{n}+1)^{2J+1} - \bar{n}^{2J+1}}{(\bar{n}+1)^{2J+1}}}{\frac{1}{(\bar{n}+1)}} = \frac{(\bar{n}+1)^{2J+1} - \bar{n}^{2J+1}}{(\bar{n}+1)^{2J}}$$

so that $$P_{-J}(\infty) = \frac{(\bar{n}+1)^{2J}}{(\bar{n}+1)^{2J+1} - \bar{n}^{2J+1}}$$

Finally, $$P_m(\infty) = \left(\frac{\bar{n}}{\bar{n}+1}\right)^{J+m} P_{-J}(\infty) = \left(\frac{\bar{n}}{\bar{n}+1}\right)^{J+m} \frac{(\bar{n}+1)^{2J}}{(\bar{n}+1)^{2J+1} - \bar{n}^{2J+1}} = \frac{\bar{n}^{J+m}(\bar{n}+1)^{J-m}}{(\bar{n}+1)^{2J+1} - \bar{n}^{2J+1}}$$

which implies that the spin ensemble, for example the spin ensemble 10 in system 1, is approaching the cavity temperature since the Boltzmann thermal distribution for the spins is given by $$\rho_\sigma = \frac{\exp(-\beta \hat{\mathcal{H}}_\sigma)}{\mathcal{Z}}; \beta = \frac{1}{k_B T}$$

and the partition function $\mathcal{Z}$ is defined as $$\mathcal{Z} = Tr[\exp(-\beta \hat{\mathcal{H}}_\sigma)]$$

with $$\hat{\mathcal{H}}_\sigma = \hbar \omega_s \hat{J}_z$$

The probability of being in the mth energy level is $$P_m = \langle m|\rho_\sigma|m\rangle = \frac{\langle m|\exp(-\beta\hat{\mathcal{H}}_\sigma)|m\rangle}{\mathcal{Z}} = \frac{e^{-m\hbar\omega_S\beta}}{\mathcal{Z}}$$

and the partition function trace is calculated as follows:

$$\mathcal{Z} = Tr[\exp(-\beta\hat{\mathcal{H}}_\sigma)] = \sum_{m=-J}^{m=+J}\langle m|\exp(-\beta\hat{\mathcal{H}}_\sigma)|m\rangle = \sum_{m=-J}^{m=+J} e^{-m\hbar\omega_S\beta} =$$

$$\sum_{k=0}^{2J} e^{-(k-J)\hbar\omega_S\beta} = e^{-m\hbar\omega_S\beta}\sum_{k=0}^{2J} e^{-k\hbar\omega_S\beta} = e^{J\hbar\omega_S\beta}\frac{1-e^{-(2J+1)\hbar\omega_S\beta}}{1-e^{-\hbar\omega_S\beta}}$$

When the spins are on resonance with the cold cavity $\hat{b}$ $$\omega_S \approx \omega_b \rightarrow e^{-\hbar\omega_b\beta} = \frac{\bar{n}}{\bar{n}+1} \rightarrow T_S \approx T_b$$

This allows to write:

$$P_m = \frac{e^{-m\hbar\omega_S\beta}}{\mathcal{Z}} = \left(\frac{\bar{n}}{\bar{n}+1}\right)^m \frac{1}{\mathcal{Z}}$$

$$\mathcal{Z} = e^{J\hbar\omega_S\beta}\frac{1-e^{-(2J+1)\hbar\omega_S\beta}}{1-e^{-\hbar\omega_S\beta}} = \left(\frac{\bar{n}}{\bar{n}+1}\right)^{-J}\frac{1-\left(\frac{\bar{n}}{\bar{n}+1}\right)^{(2J+1)}}{1-\left(\frac{\bar{n}}{\bar{n}+1}\right)} =$$

$$\left(\frac{\bar{n}}{\bar{n}+1}\right)^J \frac{\frac{(\bar{n}+1)^{2J+1}-\bar{n}^{2J+1}}{(\bar{n}+1)^{2J+1}}}{\frac{1}{(\bar{n}+1)}} = \left(\frac{\bar{n}+1}{\bar{n}}\right)^J \frac{(\bar{n}+1)^{2J+1}-\bar{n}^{2J+1}}{(\bar{n}+1)^{2J}}$$

Therefore, $$P_m = \left(\frac{\bar{n}}{\bar{n}+1}\right)^m \frac{\bar{n}^J(\bar{n}+1)^J}{(\bar{n}+1)^{2J+1}-\bar{n}^{2J+1}} = \frac{\bar{n}^{J+m}(\bar{n}+1)^{J-m}}{(\bar{n}+1)^{2J+1}-\bar{n}^{2J+1}}$$

Thus, this verifies that the spin ensemble (e.g., 10 in system 1 of FIG. 4) is in a non-thermal temperature distribution and has been placed in thermal contact with the cold cavity $\hat{b}$ (e.g., cold cavity 15 in system 1) equilibrating or cooling down the ensemble to the cavity field temperature.

The expectation of $\hat{J}_z$ can be calculated to view the temporal dynamics from another perspective:

$$\frac{d}{dt}\langle\hat{J}_z(t)\rho'_{\text{eff}}\rangle = 2\frac{\varepsilon\gamma}{\kappa_b}(\bar{n}+1)\left\langle\hat{J}_z\hat{J}_- \rho'_{\text{eff}}\hat{J}_+ - \frac{1}{2}\hat{J}_z\{\hat{J}_+\hat{J}_-, \rho'_{\text{eff}}\}\right\rangle +$$

$$2\frac{\varepsilon\gamma}{\kappa_b}\bar{n}\left\langle\hat{J}_z\hat{J}_+\rho'_{\text{eff}}\hat{J}_- - \frac{1}{2}\hat{J}_z\{\hat{J}_-\hat{J}_+, \rho'_{\text{eff}}\}\right\rangle$$

To facilitate this calculation, we evaluate the terms $$\langle\hat{J}_z\hat{J}_\mp\rho'_{\text{eff}}\hat{J}_\pm\rangle = \langle\hat{J}_\pm\hat{J}_z\hat{J}_\mp\rho'_{\text{eff}}\rangle$$

$$\langle\hat{J}_z\{\hat{J}_\pm\hat{J}_\mp, \rho'_{\text{eff}}\}\rangle = \langle\hat{J}_z(\hat{J}_\pm\hat{J}_\mp\rho'_{\text{eff}}+\rho'_{\text{eff}}\hat{J}_\pm\hat{J}_\mp)\rangle = \langle\hat{J}_z\hat{J}_\pm\hat{J}_\mp\rho'_{\text{eff}}+\hat{J}_\pm\hat{J}_\mp\hat{J}_z\rho'_{\text{eff}}\rangle$$

Within the expectation value, the operators in the first term are reduced to:

$$\hat{J}_\pm\hat{J}_z\hat{J}_\mp = \left(\sum_l \sigma_\pm^l\right)\left(\frac{1}{2}\sum_m \sigma_z^m\right)\left(\sum_n \sigma_\mp^n\right) = \frac{1}{2}\sum_{l,m,n}\sigma_\pm^l\sigma_z^m\sigma_\mp^n \equiv \frac{1}{2}\sum_k \sigma_\pm^k\sigma_z^k\sigma_\mp^k =$$

$$\frac{1}{2}\sum_k \sigma_\pm^k(2\sigma_+^k\sigma_-^k - \mathbb{1}^k)\sigma_\mp^k = \frac{1}{2}\sum_k(\pm E_\pm^k) = \mp E_\pm$$

where $$E_\pm = \frac{1}{2}(\mathbb{1}\pm\sigma_z)$$

and the operators in the second term reduce to $$\hat{J}_z\hat{J}_\pm\hat{J}_\mp = \left(\frac{1}{2}\sum_l \sigma_z^l\right)\left(\sum_m \sigma_\pm^m\right)\left(\sum_n \sigma_\mp^n\right) =$$

$$\frac{1}{2}\sum_{l,m,n}\sigma_z^l\sigma_\pm^m\sigma_\mp^n \equiv \frac{1}{2}\sum_k\sigma_z^k\sigma_\pm^k\sigma_\mp^k = \frac{1}{2}\sum_k\sigma_z^k E_\pm^k = \frac{1}{2}\sum_k(\pm E_\pm^k) = \mp E_\pm$$

similarly $$\hat{J}_\pm\hat{J}_\mp\hat{J}_z \rightarrow \hat{J}_\pm\hat{J}_\mp\hat{J}_z = \pm E_\pm$$

Letting $$\tau = 2\frac{\varepsilon\gamma}{\kappa_b},$$

we can substitute these operators into the expectation value equation to get $$\frac{d}{dt}\langle\hat{J}_z(t)\rho'_{\text{eff}}\rangle = \tau(\bar{n}+1)\left(\langle -E_+\rho'_{\text{eff}}\rangle - \frac{1}{2}\langle E_+\rho'_{\text{eff}} + E_+\rho'_{\text{eff}}\rangle\right) +$$

$$\tau\bar{n}\left(\langle E_-\rho'_{\text{eff}}\rangle - \frac{1}{2}\langle -E_-\rho'_{\text{eff}} - E_-\rho'_{\text{eff}}\rangle\right) = -2\tau(\bar{n}+1)\langle E_+\rho'_{\text{eff}}\rangle + 2\tau\bar{n}\langle E_-\rho'_{\text{eff}}\rangle =$$

$$-\tau(\bar{n}+1)\langle(\mathbb{1}+\hat{J}_z)\rho'_{\text{eff}}\rangle + \tau\bar{n}\langle(\mathbb{1}-\hat{J}_z)\rho'_{\text{eff}}\rangle = -\tau\langle\rho'_{\text{eff}}\rangle - \tau(2\bar{n}+1)\langle\hat{J}_z\rho'_{\text{eff}}\rangle$$

This expression then clearly shows the time constant $\tau(2\bar{n}+1)$ governing the temporal population dynamics. The enhanced coupling of cavity $\hat{b}$ (e.g., cold cavity 15 in system 1 of FIG. 4) mediated by the squeezing cavity $\hat{a}$ (e.g., squeezing cavity 12 in system 1) is expressed through the constant $\tau \sim \varepsilon\gamma \sim \varepsilon g_a e^{r(t)}$. Although there is a reduction of $$\varepsilon = \frac{\Gamma'}{\Delta}$$

at finite temperatures $\bar{n}\neq 0$, there is additional enhancement if the overall temperature is sufficiently low for a significant polarization effect well beyond the Boltzmann distribution.

Efficient Squeezed Noise Suppressed Cavity Cooling

As shown in the exemplary system 3 in FIG. 7, another more efficient implementation of the cavity cooling described above is based on eliminating the auxiliary or cold load cavity $\hat{b}$ (e.g., cold cavity 15 in system 1 of FIG. 4) altogether and use just the primary squeezing through cavity $\hat{a}$ (e.g., squeezing cavity 12 in system 3 of FIG. 7) with the broadband squeezed cavity (e.g., broadband squeezing cavity 13 in system 3 of FIG. 7) to directly suppress the squeezed thermal bath, thereby coupling to the cold load of the squeezing cavity. The simplified system Hamiltonian is thus $$H_0 = \omega_0 \hat{a}^+ \hat{a} + \omega_s \hat{J}_z + g(\hat{a}^+ \hat{J}_- + \hat{a}\hat{J}_+) + H_E + H_{SE}$$

$$H_E = \sum_{k=1}^{M} g_k \hat{d}_k^+ \hat{d}_k \quad \& \quad H_{SE} = \sum_{k=1}^{M} g_k (\hat{d}_k^+ \hat{a} + \hat{d}_k \hat{a}^+)$$

Following the same steps above with the squeezed noise suppression will cool the spins to the squeezing cavity â temperature.

The descriptions of the various exemplary embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:

1. A method to hyperpolarize a spin ensemble, the method comprising:
    resonantly coupling the spin ensemble to a cold cavity that is at a temperature below a spin temperature of the spin ensemble;
    coupling the cold cavity to a squeezing cavity that is detuned from the cold cavity, the squeezing cavity squeezing the cold cavity such that coupling of the cold cavity to the spin ensemble increases to a sufficient strength to enable a spontaneous emission process to exceed a spin thermal relaxation process of the spin ensemble; and
    coupling the squeezing cavity to a broadband squeezing cavity having a same squeezing parameter as the squeezing cavity and being phase-matched with the squeezing cavity for suppressing or canceling squeezed noise or heat generated by the squeezing cavity.

2. The method according to claim 1, wherein, prior to the resonantly coupling the spin ensemble, the cold cavity, the squeezing cavity, and the broadband squeezing cavity are thermally insulated and through cryocooling are maintained at temperatures between 10 milli-Kelvin and 10 Kelvin.

3. The method according to claim 1, wherein the hyperpolarization of the spin ensemble is operated at a temperature above the cold cavity and up to an ambient temperature.

4. The method according to claim 1, wherein the hyperpolarization of the spin ensemble is achieved within a time less than a time of the spin thermal relaxation process of the spin ensemble.

5. The method according to claim 1, wherein, in the squeezing of the cold cavity, the cold cavity couples with the spin ensemble with sufficient strength to enable the spontaneous emission process to exceed the spin thermal relaxation process, thereby increasing a polarization of the spin ensemble more than a thermal equilibrium polarization of the spin ensemble.

6. The method according to claim 1, wherein the coupling of the cold cavity to the squeezing cavity includes quantum squeezing to increase the resonant coupling of the spin ensemble to the cold cavity and reach sufficient strength to enable spin cooling.

7. The method according to claim 1, wherein quantum squeezing of the cold cavity is implemented by modulating a squeezing cavity resonance frequency.

8. A method to hyperpolarize a spin ensemble, the method comprising:
    resonantly coupling the spin ensemble to a squeezing cavity, which is at a temperature below a spin temperature of the spin ensemble, to enable a spontaneous emission process to exceed a spin thermal relaxation process of the spin ensemble; and
    coupling the squeezing cavity to a broadband squeezing cavity having a same squeezing parameter as the squeezing cavity and being phase-matched with the squeezing cavity for suppressing or canceling squeezed noise or heat generated by the squeezing cavity.

9. The method according to claim 8, wherein, prior to the resonantly coupling of the spin ensemble, the squeezing cavity and the broadband squeezing cavity are thermally insulated and through cryocooling are maintained at temperatures between 10 milli-Kelvin and 10 Kelvin.

10. The method according to claim 8, wherein the hyperpolarization of the spin ensemble is operated at a temperature above the squeezing cavity and up to an ambient temperature.

11. The method according to claim 8, wherein the hyperpolarization of the spin ensemble is achieved within a time less than a time of the spin thermal relaxation process of the spin ensemble.

12. The method according to claim 8, wherein the resonantly coupling of the spin ensemble to the squeezing cavity squeezes the spin ensemble with sufficient strength to enable the spontaneous emission process to exceed the spin thermal relaxation process, thereby increasing a polarization of the spin ensemble more than a thermal equilibrium polarization of the spin ensemble.

13. The method according to claim 8, wherein quantum squeezing of the squeezing cavity is implemented by modulating a squeezing cavity resonance frequency.

14. The method according to claim 8, wherein squeezing of the squeezing cavity increases coupling of the squeezing cavity to a cryogen or to a cold load, thereby increasing a cooling efficiency.

15. A hyperpolarizing system, comprising:
    a spin ensemble immersed in a static magnetic field;
    a squeezing cavity held at a temperature below a spin temperature of the spin ensemble, the spin ensemble being resonantly coupled to the squeezing cavity to enable a spontaneous emission process to exceed a spin thermal relaxation process of the spin ensemble; and
    a broadband squeezing cavity coupled to the squeezing cavity, the broadband squeezing cavity having a same squeezing parameter as the squeezing cavity and being phase-matched with the squeezing cavity for suppressing or canceling squeezed noise or heat generated by the squeezing cavity, thereby to increase polarization of the spin ensemble more than a thermal equilibrium polarization of the spin ensemble.

16. The system according to claim 15, wherein, prior to the resonantly coupling of the spin ensemble, the squeezing cavity and the broadband squeezing cavity are thermally insulated and through cryocooling are maintained at temperatures between 10 milli-Kelvin and 10 Kelvin.

17. The system according to claim 15, wherein the hyperpolarization of the spin ensemble is operated at a temperature above the squeezing cavity and up to an ambient temperature.

18. The system according to claim 15, wherein the hyperpolarization of the spin ensemble is achieved within a time less than a time of the spin thermal relaxation process of the spin ensemble.

19. The system according to claim 15, wherein, in the resonant coupling of the spin ensemble to the squeezing cavity, the squeezing cavity squeezes the spin ensemble with sufficient strength to enable the spontaneous emission process to exceed the spin thermal relaxation process, thereby increasing a polarization of the spin ensemble more than a thermal equilibrium polarization of the spin ensemble.

20. The system according to claim 15, wherein quantum squeezing of the squeezing cavity is implemented by modulating a squeezing cavity resonance frequency.

21. The system according to claim 15, wherein squeezing of the squeezing cavity increases coupling of the squeezing cavity to a cryogen or to a cold load, thereby increasing a cooling efficiency.

* * * * *